(12) United States Patent
Nedic et al.

(10) Patent No.: US 12,273,075 B2
(45) Date of Patent: Apr. 8, 2025

(54) SYSTEMS AND METHODS FOR POWER DISTRIBUTION FOR AMPLIFIER ARRAYS

(71) Applicant: Epirus, Inc., Hawthorne, CA (US)

(72) Inventors: Velimir Nedic, Los Angeles, CA (US); Maxwell Anthony Bilodeau, Redondo Beach, CA (US); Alexander Paul Scott, Redondo Beach, CA (US); Harry Bourne Marr, Jr., Manhattan Beach, CA (US); Denpol Kultran, Torrance, CA (US); Michael Alex Borisov, Long Beach, CA (US); Yiu Man So, Hawthorne, CA (US)

(73) Assignee: Epirus, Inc., Torrance, CA (US)

( * ) Notice: Subject to any disclaimer, the term of this patent is extended or adjusted under 35 U.S.C. 154(b) by 891 days.

(21) Appl. No.: 17/365,852

(22) Filed: Jul. 1, 2021

(65) Prior Publication Data

US 2023/0006615 A1    Jan. 5, 2023

(51) Int. Cl.
| | |
|---|---|
| *H03F 1/52* | (2006.01) |
| *H02J 13/00* | (2006.01) |
| *H02M 7/00* | (2006.01) |
| *H02M 7/44* | (2006.01) |
| *H03F 3/21* | (2006.01) |

(52) U.S. Cl.
CPC .......... *H03F 1/52* (2013.01); *H02J 13/00002* (2020.01); *H02M 7/003* (2013.01); *H02M 7/44* (2013.01); *H03F 3/21* (2013.01); *H03F 2200/426* (2013.01); *H03F 2200/451* (2013.01)

(58) Field of Classification Search
CPC .. H03F 1/52; H03F 3/21; H02J 13/00; H02M 7/003; H02M 7/44

USPC ......................................................... 330/297
See application file for complete search history.

(56) References Cited

U.S. PATENT DOCUMENTS

| | | | | |
|---|---|---|---|---|
| 5,341,114 A | * | 8/1994 | Calviello | H03G 11/025 330/135 |
| 5,880,648 A | | 3/1999 | Aves | |
| 5,945,941 A | * | 8/1999 | Rich, III | H02J 1/00 342/158 |
| 7,102,427 B2 | * | 9/2006 | Matsumoto | H03F 1/0227 330/136 |

(Continued)

FOREIGN PATENT DOCUMENTS

| | | |
|---|---|---|
| WO | 2009/081912 A1 | 7/2009 |
| WO | 2020/161765 A1 | 8/2020 |

OTHER PUBLICATIONS

Patent Cooperation Treaty, International Preliminary Report on Patentability issued in PCT/US2022/022921, Oct. 3, 2023, pp. 1-6.

(Continued)

*Primary Examiner* — Patricia T Nguyen
(74) *Attorney, Agent, or Firm* — Pillsbury Winthrop Shaw Pittman LLP

(57) ABSTRACT

Systems and apparatuses are disclosed that include a distributed power system configured to provide power to a number of loads. The system includes power converters configured to receive DC power from a common power source, each of the plurality of power converters configured to provide DC power to a corresponding load from. Each of the power converters is positioned proximal to the corresponding load that it powers.

20 Claims, 16 Drawing Sheets

(56) References Cited

U.S. PATENT DOCUMENTS

| | | | |
|---|---|---|---|
| 7,183,841 B2* | 2/2007 | Fenk | H03F 3/211 |
| | | | 330/285 |
| 7,242,518 B1 | 7/2007 | Lynch et al. | |
| 7,256,650 B1 | 8/2007 | Stockert | |
| 7,388,433 B1 | 6/2008 | Hecht | |
| 7,392,011 B1 | 6/2008 | Jacomb-Hood | |
| 7,508,338 B2 | 3/2009 | Pluymers | |
| 8,193,864 B2* | 6/2012 | Model | H03F 3/189 |
| | | | 330/297 |
| 8,289,084 B2* | 10/2012 | Morimoto | H03F 3/195 |
| | | | 330/296 |
| 8,718,580 B2 | 5/2014 | Borodulin et al. | |
| 9,065,163 B1 | 6/2015 | Wu | |
| 10,224,184 B2 | 3/2019 | Van Zyl | |
| 10,749,490 B1* | 8/2020 | Piernas | H04B 1/18 |
| 10,938,347 B2 | 3/2021 | Rofougaran et al. | |
| 10,958,323 B1 | 3/2021 | Ben-Yishay et al. | |
| 11,005,514 B2 | 5/2021 | Cordier | |
| 11,012,120 B2 | 5/2021 | Guillot | |
| 11,094,507 B2 | 8/2021 | Funk et al. | |
| 2003/0227330 A1 | 12/2003 | Khanifar et al. | |
| 2006/0049870 A1 | 3/2006 | Hellberg | |
| 2006/0267563 A1 | 11/2006 | Belson et al. | |
| 2008/0018519 A1 | 1/2008 | Berg et al. | |
| 2008/0036430 A1* | 2/2008 | Li | H02M 3/157 |
| | | | 323/222 |
| 2008/0153435 A1 | 6/2008 | Hirano et al. | |
| 2008/0174469 A1 | 7/2008 | Stark et al. | |
| 2008/0297414 A1 | 12/2008 | Krishnaswamy et al. | |
| 2010/0237884 A1 | 9/2010 | Bult et al. | |
| 2012/0200281 A1 | 8/2012 | Herbsommer et al. | |
| 2012/0212294 A1 | 8/2012 | Model | |
| 2013/0120190 A1 | 5/2013 | McCune, Jr. | |
| 2014/0266460 A1 | 9/2014 | Nobbe et al. | |
| 2014/0312970 A1* | 10/2014 | Nagasaku | H03F 3/24 |
| | | | 330/297 |
| 2015/0017933 A1* | 1/2015 | McCallister | H04B 1/0475 |
| | | | 455/114.3 |
| 2015/0061769 A1 | 3/2015 | Bodnar | |
| 2015/0270806 A1 | 9/2015 | Wagh et al. | |
| 2015/0270810 A1* | 9/2015 | Martin | H03F 3/68 |
| | | | 330/10 |
| 2016/0036113 A1 | 2/2016 | Wu et al. | |
| 2016/0049909 A1 | 2/2016 | Scherrer | |
| 2016/0099610 A1 | 4/2016 | Leabman et al. | |
| 2016/0127060 A1 | 5/2016 | Cross | |
| 2016/0282450 A1 | 9/2016 | Kishigami et al. | |
| 2016/0294335 A1* | 10/2016 | Plaze | H03G 11/002 |
| 2017/0077877 A1* | 3/2017 | Anderson | H03F 1/0261 |
| 2017/0180011 A1 | 6/2017 | Charvat et al. | |
| 2017/0359033 A1 | 12/2017 | Bazzani | |
| 2018/0131102 A1 | 5/2018 | Wang | |
| 2018/0234203 A1 | 8/2018 | Hsiao et al. | |
| 2019/0058448 A1 | 2/2019 | Seebacher | |
| 2020/0036334 A1 | 1/2020 | Witt et al. | |
| 2020/0254947 A1 | 8/2020 | Shinoda et al. | |
| 2020/0395894 A1 | 12/2020 | Esmael | |
| 2021/0057813 A1 | 2/2021 | So et al. | |
| 2021/0399700 A1* | 12/2021 | Kultran | H03F 3/602 |
| 2022/0060016 A1 | 2/2022 | Mitsunaga | |
| 2022/0115782 A1 | 4/2022 | Marr et al. | |
| 2022/0158346 A1 | 5/2022 | Marr et al. | |

OTHER PUBLICATIONS

Patent Cooperation Treaty, International Search Report issued in PCT/US2020/021895, Jun. 9, 2020, pp. 1-2.
Manh et al., "An Independently Biased 3-stack GaN HEMT Configuration for 5G Mobile Networks", 2019 26th International Conference on Telecommunications (ICT), 2019, pp. 1-5, doi: 10.1109/ICT.2019.8798858.
Ampleon, "AN11226 TTL bias switching", Application note, Rev. 2, Sep. 1, 2015, pp. 1-13, The Netherlands B.V.
Barsegyan et al., "Bias Sequencing and Gate Pulsing Circuit for GaN Amplifier", 10th International Radar Symposium India, 2015, pp. 1-5, NIMHANS Convention Centre, Bangalore India.
Wang et al., "60% Efficient 10-GHz Power Amplifier With Dynamic Drain Bias Control", IEEE Transactions on Microwave Theory and Techniques, Mar. 2004, pp. 1-5, vol. 52(3).
Sheppard et al., "High-Power Microwave GaN/AlGaN HEMT's on Semi-Insulating Silicon Carbide Substrates", IEEE Electron Device Letters, Apr. 1999, pp. 161-163, vol. 20(4).
Korovin et al., "Pulsed Power-Driven High-Power Microwave Sources", Proceedings of the IEEE, Jul. 2004, pp. 1082-1095, vol. 92(7).
Delos et al., "Unique Gate Drive Applications Enable Rapidly Switching On/Off for Your High Power Amplifier", Analog Dialogue 51-12, Dec. 2017, pp. 1-4.
Gold et al., "Review of high-power microwave source research", Review of Scientific Instruments 68, 1997, pp. 1-31, 68, 3945, https://doi.org/10.1063/1.1148382.
Schafer et al., "X-Band MMIC GaN Power Amplifiers Designed for High-Efficiency Supply-Modulated Transmitters", IEEE Xplore, 2013 IEEE MTT-S International Microwave Symposium Digest (MTT), Jun. 2-7, 2013, pp. 1-3.
Pajic et al., "X-Band Two-Stage High-Efficiency Switched-Mode Power Amplifiers", IEEE Transactions on Microwave Theory and Techniques, Sep. 2005, vol. 52(9).
Patent Cooperation Treaty, International Search Report and Written Opinion issued in PCT/US2021/038529, Nov. 10, 2021, pp. 1-12.
Patent Cooperation Treaty, International Preliminary Report on Patentability issued in PCT/IB2022/05509, Jan. 11, 2024, pp. 1-11.

* cited by examiner

SYSTEMS AND METHODS FOR POWER DISTRIBUTION FOR AMPLIFIER ARRAYS

DESCRIPTION OF THE RELATED ART

Radio-frequency (RF) applications often involve amplifying a RF signal to a power level suitable for applications in defense, policing, industrial applications, or the like. Amplifier arrays can be of significant size in order to contain the required number of amplifiers. Other approaches for RF amplification include radial combiners or Gysel combiners. Current RF amplifier systems, particularly those for high-power applications, are susceptible to overloading and struggle with delivering power in a stable manner.

SUMMARY

In one aspect, a distributed power system is configured to provide power to a number of loads, the system comprising: power converters configured to receive DC power from a common power source, each of the plurality of power converters configured to provide DC power to a corresponding load from the loads. Each of the power converters is positioned proximal to the corresponding load that it powers.

In some variations, each of the power converters can be integrated with the corresponding load and can be on a printed circuit board (PCB) and/or connected to the corresponding load by a wire having a length less than about 5 inches.

In other variations, the power converter providing power to the amplifier can include an output filter to provide regulate power provided to the amplifier, the output filter comprising a capacitor associated with the amplifier. The capacitor can be a bulk capacitor used to provide enough energy to support operation of the amplifier in a pulsed mode, and a fast capacitor used to provide initial load demand and improve high-frequency regulator response.

In yet other variations, the power converters can include a limiter configured to limit the amount of power drawn by the load. At least one of the power converters can include a sensor configured to sense a current or a voltage drawn by the load. A programmable processor can be configured to: monitor the sensor output; and adjust an amount of current or voltage provided to the load.

In an interrelated aspect, a system for amplifying high-frequency or pulsed RF signals includes an amplifier and a split capacitor system connected between a power supply and the amplifier, the split capacitor system comprising: a fast capacitor; and a bulk capacitor. The bulk capacitor has a slower response and more energy storage than the fast capacitor.

In some variations, the fast capacitor can be a ceramic capacitor and the bulk capacitor can be an electrolytic capacitor. The amplifier can be configured amplify RF signals in a pulsed mode, wherein an initial portion of the current needed for an RF pulse is delivered to the amplifier by the fast capacitor. For example, the fast capacitor can be configured to provide more current than the bulk capacitor in response to a voltage change across the fast capacitor and the bulk capacitor when the rate at which the voltage changes is greater than or equal to about 100 MHz.

In an interrelated aspect, a system for protecting amplifiers for high-frequency or pulsed RF signals, the system comprising: an amplifier; and a limiter configured to limit the amount of current or power drawn by the amplifier, the limiter including a plurality of inductors such that power through the limiter always passes through at least one of the plurality of inductors.

In some variations, the limiter can be a voltage limiter configured to maintain a constant voltage across an output inductor through which an output current passes or can be current limiter configured to maintain a constant current across an output inductor through which an output current passes. The limiter can include an input inductor configured to receive an input current; and a second switch connected between a first ground and an input of the input inductor, the system configured to open the second switch in response to an overvoltage or overcurrent status and thereby shunt the input current at least partially to ground. The limiter can also include an output inductor configured to receive an output current; a capacitor connected between the output inductor and a second ground; and a third switch connected between the capacitor and an input inductor, the system configured to open the third switch in response to an overvoltage or overcurrent status and thereby shunt the input current at least partially to the capacitor. The switches can be connected to a control system configured to open the second switch and the third switch synchronously in response to an overvoltage or overcurrent status.

In an interrelated aspect, a system includes a power source (e.g., a battery, a generator or a AC-DC converter); an amplifier powered by the power source; and at least one programmable processor; a non-transitory machine-readable medium storing instructions which, when executed by the at least one programmable processor, cause the at least one programmable processor to perform operations comprising: monitoring, with a sensor, gate voltage of the amplifier; determining that the gate voltage is not, or is expected not to be, in a range between an upper threshold and a lower threshold; and maintaining the voltage to be within the range between the upper threshold and the lower threshold.

In some variations, the range can be between −2V and −5V and the maintaining can include drawing power from a battery backup system to maintain the gate voltage to be within the range. Also, the operations can include shutting off a supply voltage to the amplifier. Operations can further include determining, by a machine-learning algorithm, a gate voltage threshold that is the most positive voltage in the range.

Implementations of the current subject matter can include, but are not limited to, methods consistent with the descriptions provided herein as well as articles that comprise a tangibly embodied machine-readable medium operable to cause one or more machines (e.g., computers, etc.) to result in operations implementing one or more of the described features. Similarly, computer systems are also contemplated that may include one or more processors and one or more memories coupled to the one or more processors. A memory, which can include a computer-readable storage medium, may include, encode, store, or the like, one or more programs that cause one or more processors to perform one or more of the operations described herein. Computer implemented methods consistent with one or more implementations of the current subject matter can be implemented by one or more data processors residing in a single computing system or across multiple computing systems. Such multiple computing systems can be connected and can exchange data and/or commands or other instructions or the like via one or more connections, including but not limited to a connection over a network (e.g., the internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims. While certain features of the currently disclosed subject matter are described for illustrative purposes in relation to particular implementations, it should be readily understood that such features are not intended to be limiting. The claims that follow this disclosure are intended to define the scope of the protected subject matter.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

DETAILED DESCRIPTION

The present disclosure provides examples of systems and methods for power amplifiers that provide several benefits over the state of the art. For example, amplifier systems are disclosed that have higher power density, are compact, scalable, have improved cooling, have reduced electromagnetic interference (EMI), etc. Such features are important for providing compact, high-power RF amplification, with applications in industry, defense, radar, communications, signal jammers, etc. The systems and methods described herein can also be used in systems employing high power semiconductor devices used in electrical vehicle charging applications.

Figure 1:
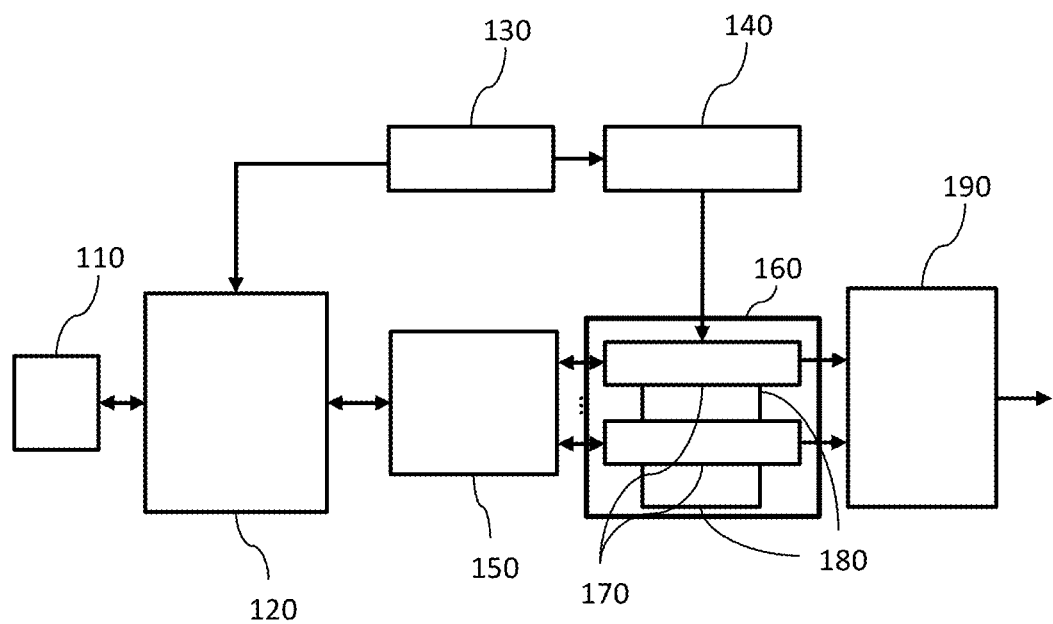
FIG. 1 is a simplified block diagram illustrating an amplifier and control system, in accordance with certain aspects of the present disclosure.

The overall system, as shown in FIG. 1, is designed for high power radio frequency transmissions, such as in high power microwave, directed energy, radar, and communications applications. The mission computer 120 runs the software code controlling the system, generally receives control commands, and prioritizes the hardware according to those commands. For example, the mission computer, in a directed energy application, receives inputs about the location of targets such as automated target cues from an external radar, from a user who is using a user console to select targets, or from an automated target recognition and classification software based on image or radar inputs. The mission computer, 120 can be configured to determine duty cycle, pulse repetition rate, signal frequency and modulation characteristics of a waveform to be transmitted from the system and translate these into phase and waveform commands for a waveform generator 150. In various implementations, the waveform generator 150 can comprise a RF field programmable gate array (FPGA). These waveform commands are also synchronized with the line replaceable modular power amplifiers, 170 (also referred to herein as "modular power amplifier"). In some embodiments the waveform is generated directly in the modular power amplifier 170, if a direct digital synthesizer or waveform generator is contained in the modular power amplifiers, 170, instead of the waveform generator RF FPGA 150. The modular power amplifier 170 can be connected to a batter, a generator or some other power Alternating Current (AC) power source. For example, in some implementations, the modular power amplifier 170 can be connected to an AC power source through the AC power system 130. The AC power system 130 can have current monitoring, current control, and on/off switches. In some implementations, the AC power system can be controlled by the mission computer 120. The AC power system 130 can also translate voltages from AC to DC with AC/DC conversion. In some systems this AC/DC conversion happens in a centralized way right after the AC power is received from the AC power unit 130, or in other embodiments the AC/DC conversion is done locally on each modular power amplifier 170, where each one has its own power distribution unit 140. In some embodiments the AC/AC conversion and AC/DC conversion is done in multiple steps, where voltage and current levels are changed, this is done in the AC power unit 130. The power distribution unit (PDU), 140 will generally translate the voltage to the final direct current (DC) voltage needed by each amplifier input as discussed below with reference to FIGS. 10-13. In various implementations, the PDU can be configured to generate DC voltage in a range between 10 V-100 V. For example, in one embodiment, there are 65 volt, 50 volt, and 12 volt regulators on board the power distribution unit to power the modular power amplifier voltages. The PDU 140 regulates these voltages, also stores energy to provide impulses of power without the voltage level drooping, and generally is in charge of providing a constant DC voltage to the modular power amplifiers 170. The PDU 140 may also have current sensors, current monitoring, and current limiters. The system illustrated in FIG. 1 can be configured as a phased array configuration, so multiple power amplifier can connect to an antenna element to create an array of radiating antennas 190. These antenna elements 190, can have special connectors designed to handle very high voltage levels and power levels, in the directed energy application and must have their impedance well matched to the modular power amplifiers. Overall, the mission computer 120 commands waveforms and the power sources, the power sources 130 and 140 translate power into the voltages and currents needed to drive the modular power amplifiers 170, the modular power amplifiers 170 amplify the RF signal to very high levels and radiate out of the antennas 190. In some embodiments, the modular power amplifiers may be in contact with a thermal pad 180 for heat dissipation.

In the implementation illustrated in FIG. 1, a user input device 110 can provide input or command to the computer 120. The user input device 110 can be a computer, tablet, smartphone, an augmented reality/virtual reality device or any computing device capable of receiving text, mouse, touch, voice commands, etc. from a user. The computer 120 can control the operation of the waveform generator 150 and/or the modular power amplifiers 170 based on the input or commands received from input device 110. As discussed above, computer 120 can also be in communication with power supplies for the amplifier systems disclosed herein. For example, an AC (or DC) power supply 130 can be controlled by computer 120 to deliver power to a power distributor 140.

In some implementations, the RF pulse amplified by the amplifier systems disclosed herein can be generated from a waveform generator 150 that may be in communication with computer 120. The waveform generator generates the radio frequency waveforms through a digital to analog converter (DAC). The DAC can have a digital input which can receive a stream of binary data that represents the amplitude of the analog waveform that is output. This binary data can be fed from computer memory where the binary representation of the samples of a waveform is stored or the binary data can be generated by direct digital synthesizers (DDS). Some embodiments may include an array of DACs, each with its own binary stream. The binary stream can be controlled such that there is a phase offset between the waves going to the different DACs to generate a beam.

The waveform generator 150 can provide RF signals to be amplified to an amplifier assembly 160 containing an arbitrary number of modular power amplifiers 170. As described in further detail herein (e.g., with reference to FIGS. 7-9), such modular power amplifiers 170 can have an efficient 3D configuration in the amplifier assembly, allowing for numerous technical improvements over conventional 2D amplifier systems. For example, cooling elements such as fans, heat sinks, etc. can be interspersed within the amplifier assembly between two or more of the modular power amplifiers. The output of the modular power amplifiers can then be delivered to an antenna array 190, which may be an EMP system.

Examples of applications of the disclosed systems can include L-band systems capable of providing RF power output in the kilowatt range (e.g., 1 kW, 3 kW, 5 kW, 12 kW, 20 kW, etc.), though power output will vary with implementation and should not be limited to the examples provided. Similarly, the RF frequencies that may be utilized in the disclosed systems need not be limited to L-band systems but may include other frequencies as well, such as for example, S-band, K-band, etc.

Figure 2:
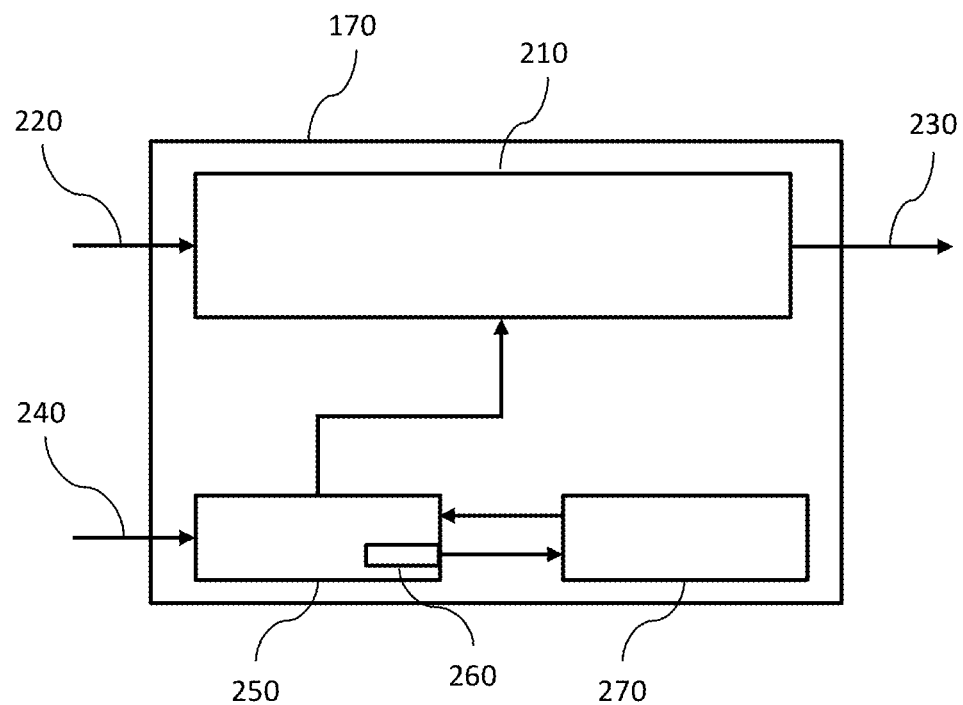
FIG. 2 is a simplified block diagram illustrating a modular power amplifier, in accordance with certain aspects of the present disclosure.

A block diagram of an exemplary modular power amplifier is illustrated in FIG. 2. The modular power amplifier 170 can include an amplifier subsystem 210, which can receive RF input signal 220 and provides an amplified RF output signal 230. Modular power amplifier 170 can receive input power 240 at a power distribution module 250 and a power sequencer 270. These components can provide power for components of the modular power amplifier, as described in further detail herein. In this way, an amplifier subsystem 210 can be independently controlled to provide a particular RF output signal.

In some implementations, power distribution module may include a current sensor 260 for monitoring of current output to the amplifier subsystem. The current sensor can then provide information to the power sequencer to adjust the power output from the power distribution module. Reading the current of the power amps during operation alerts the system to the health of the power amplifiers, that the current is within the expected range. The current also enables the system to infer the temperature of the power amplifiers during operation since the current will rise for a given power output as the temperature increases. The current sensor can also be used to detect the set point of the power amplifiers prior to operation; when the power amplifiers are off with no RF input, leakage current will change as a function of the bias current being applied. This leakage current is read in the current sensor until the desired current is detected, and thus gives the desired gate voltage set point that should be applied during operation. In one embodiment, the set point can be detected automatically prior to operation by slowly tuning the gate bias voltage until the ideal leakage current is detected. This voltage bias set point can be stored in memory and then during operation, applied when RF is applied. If the current reading is either very low, indicating the power amplifier is no longer pulling any power, or it is very high, indicating a short, this indicates the power amplifier is no longer operational. In this way, the health of the power amplifier can be determined by reading the current.

The power distribution module 250 can be configured to regulate an amount of power input (e.g., input power 240) to intermediate power amplifier(s) (see, e.g., FIG. 3) of the amplifier subsystem. Specifically, the power distribution module 250 can receive power at a given voltage, but provide power as needed (e.g., 50V, 65V, etc.) to the amplifier subsystem.

The power distribution module 250 provides several features. First it can regulate the voltage received from the power supply to the power amplifiers, such as a 50 volt supply to the drain of the gallium nitride power amp transistors. In some embodiments, the power distribution unit can provide DC to DC conversion of the voltage (e.g., acting as a voltage divider), such as if the incoming voltage from the power supply is much higher than the power amplifier voltage. Second, power distribution module 250 can contain current sensor 260 where the power distribution unit 270 detects the current and reports the current back to the power sequencer for use in determining gate voltage bias set point and power amplifier health. Third, the power distribution unit 250 can also provide a current limiter to limit the current to the power amplifiers; this prevents the power amplifiers from blowing out should any errors occur such as a short, electromagnetic interference, loss of power, or other causes that would cause an incorrect gate bias voltage, and thus a dangerous over-current situation without a current limiter. In some embodiments, no more than a threshold amount of current (e.g., 0.5-60 Amperes) can go through the power amplifiers before failure, so such a current limiter on the PDU can be set to the threshold amount. The power distribution unit consists of voltage regulators, analog to digital converters to read the current, as well as a current limiter circuit made of transistors, diodes and resistors.

In some implementations power sequencer 270 can be configured to control the timing of power delivery by the power distribution module. For example, the power sequencer can turn on or off the gate bias to the intermediate power amplifiers in synchronization with the RF input. This has the benefit of controlling the power and improve heat dissipation. The power sequencer circuit can include analog to digital converters (ADC) to read voltages and currents from power amplifier circuits, digital to analog converters (DAC) to apply voltages to power amplifier circuits, such as gate bias voltages, as well as a processor such as a microcontroller or field programmable gate array (FPGA). The power sequencer can have digital input pins for receiving commands when radio frequency signals are being applied to the amplifier circuit. In this way the power sequencer can apply a gate bias voltage to turn the power amplifier "ON" just as RF signals are flowing through the power amplifier and then remove the gate bias voltage to turn the power amplifier "OFF" when no RF is flowing to save power. The power sequencer also has a memory to store gate bias set points. In the preferred embodiment, the power sequencer can have a plurality of ADCs and DACs to control multiple power amplifiers simultaneously.

Figure 3A:
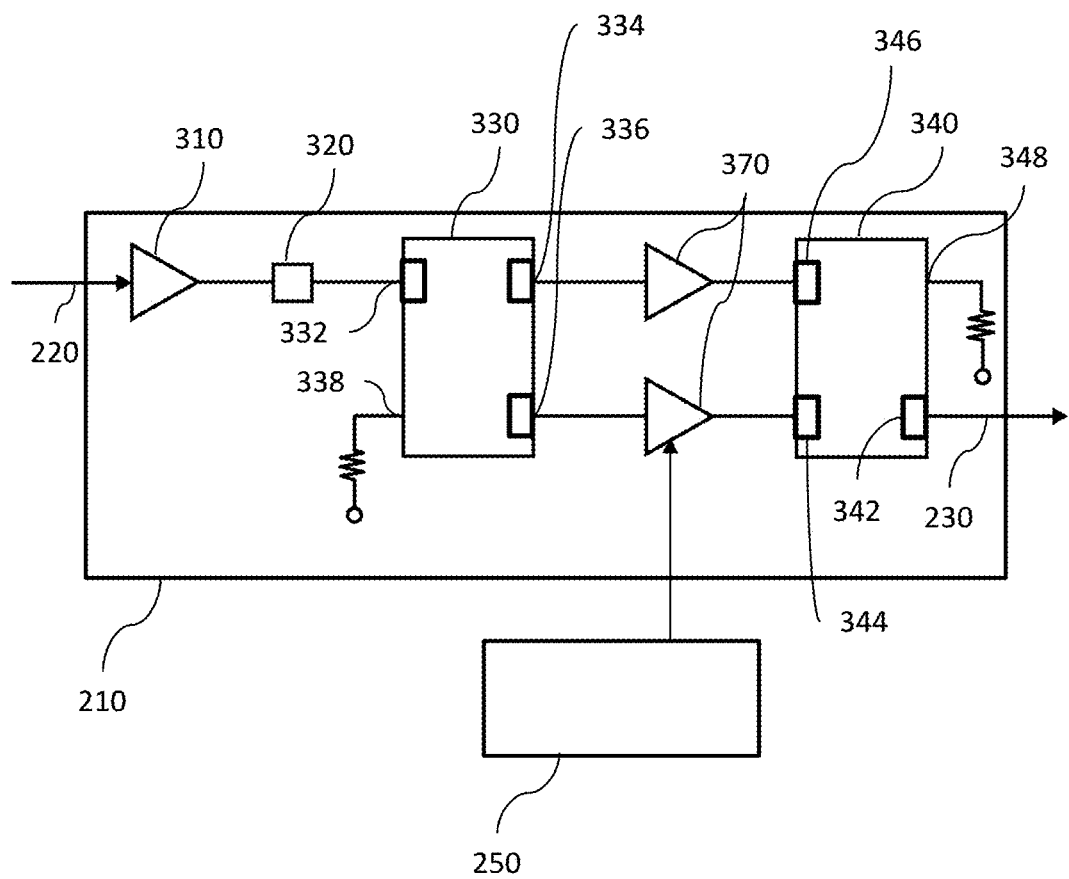
FIG. 3a is a simplified block diagram illustrating an amplifier subsystem, in accordance with certain aspects of the present disclosure.

Amplification of the RF input signal for a given modular power amplifier occurs in one or more amplifier subsystems. As shown in FIG. 3a, an example amplifier subsystem 210 (of modular power amplifier 170) can receive RF input signal 220 at an optional preamplifier 310, which is in turn connected to bandpass filter 320. Bandpass filter 320 can limit the frequency ranges of the signals passing through the system to a specified bandwidth. Power amplifiers can provide higher power out and higher gain when the bandwidth is smaller, so limiting bandwidth helps increase the gain and power of the amplifier system. Bandpass filter 320 can also eliminate out-of-band spurs, harmonics, and other out-of-band content. In other embodiments, bandpass filter 320 can instead be a low-pass filter or a high-pass filter to eliminate either high frequency content or low frequency content, respectively.

Amplifier subsystem 210 can also include, in some implementations, a number of 90 degree hybrid blocks that can split or combine an RF signal by respectively adding or removing a 90 degree phase shift to the split RF signal. Such RF signal components can be amplified individually and later recombined. For example, a first 90 degree hybrid 330 can be configured to receive an RF signal and output a split RF signal with components having a 90 degree phase shift. As shown in FIG. 3, 90 degree hybrid 330 can have RF i/o port 332, a "0 degree" port 334, and a "90 degree" port 336. The 90 degree hybrid block 330 can also have a dump port 338 which includes a termination to dump mismatches.

A similar, or even identical, second 90 degree hybrid block 340 in the amplifier subsystem 210 can be configured to receive and combine the split RF signal by removing the 90 phase shift. As apparent from FIG. 3a, the unshifted RF signal component from the 0 degree port 334 goes into the 90 degree input port 346. Similarly, the shifted RF signal component from the 90 degree port 336 goes into the 0 degree input port 344. The two signals can be combined and output through RF i/o port 342. 90 degree hybrid block 340 can also have a dump port 348.

In some implementations, a high-power amplifier(s) 370 can be configured to amplify at least one component of the split RF signal. For improvement of the amplification process, the bias for the high-power amplifier 370 can be independently controlled via the power distribution module. The 90 degree hybrid combiner 340 combines the two high-power amplifiers 370, to create a signal of double the power that the individual high-power amplifier 370, can produce, and transmits this out of the output port of the hybrid power amp 230. In FIG. 3a, the power distribution module 250 and power sequencer module 270, are connected to the high-power amplifiers 370. In one embodiment, the power sequencer 270 can control the gate bias voltage to some or all of the amplifiers in the hybrid combination network such that they are synchronized. In some embodiments, the power sequencer module 270 turns on the pre amplifiers 310 just before the high power amplifiers 370.

In other implementations, any/either/both 90 degree hybrid block can include a resistor configured to dissipate at least a portion of RF power going through the 90 degree hybrid block when the RF power is above a threshold. For example, such power dissipation can be used to reduce voltage standing wave ratio effects, thus improving the robustness of the amplifier system.

In many power amplifier systems the voltage standing wave ratio (VSWR) is a critical parameter. VSWR measures the total amount of power vs. how much power is transmitted and radiated out of the antenna. If power gets reflected back into the power amplifier system, this reduces the efficiency of the power amplifier system since not all of the power gets radiated, and high power levels such as with high power microwave and electromagnetic pulse applications, jamming, and high power radar, will damage the power amplifier system. In implementations using other means of power combining, such as using Gysel combiners or radial combiners, if one leg of the circuit fails due to lack of protection, the entire 2-way, 4-way, or many-way combined Gysel or radial circuit will completely fail. In this way, the disclosed resistive dissipation provides a significant technical improvement over prior art systems. While one VSWR ratio that is usually acceptable is no more than 2:1, 1.5:1 can be used for conservative systems. Power combiners, such as this 90 degree hybrid approach, can dissipate VSWR levels at up to 10:1 (and potentially higher) and so is very safe. VSWR depends on how well matched the resonant frequency of the power amplifier circuit is to the resonant frequency of the antenna. In some implementations, matching circuits can be created such that multiple frequencies are resonant in the power amplifier and the antenna is broadband and covers many frequencies. As the frequency being transmitted differs from the resonant frequency the VSWR gets worse. Temperature variations also degrade VSWR, other antenna elements in an array mutually coupling also degrades VSWR, anything that changes the impedance of the circuit changes VSWR. Thus, VSWR can change very dynamically throughout the operation of a radio frequency system, and instantaneously, it is possible for the VSWR to reach to very high levels such as up to 10:1 (or more), illustrating the benefits of the disclosed protective circuit.

Figure 3B:
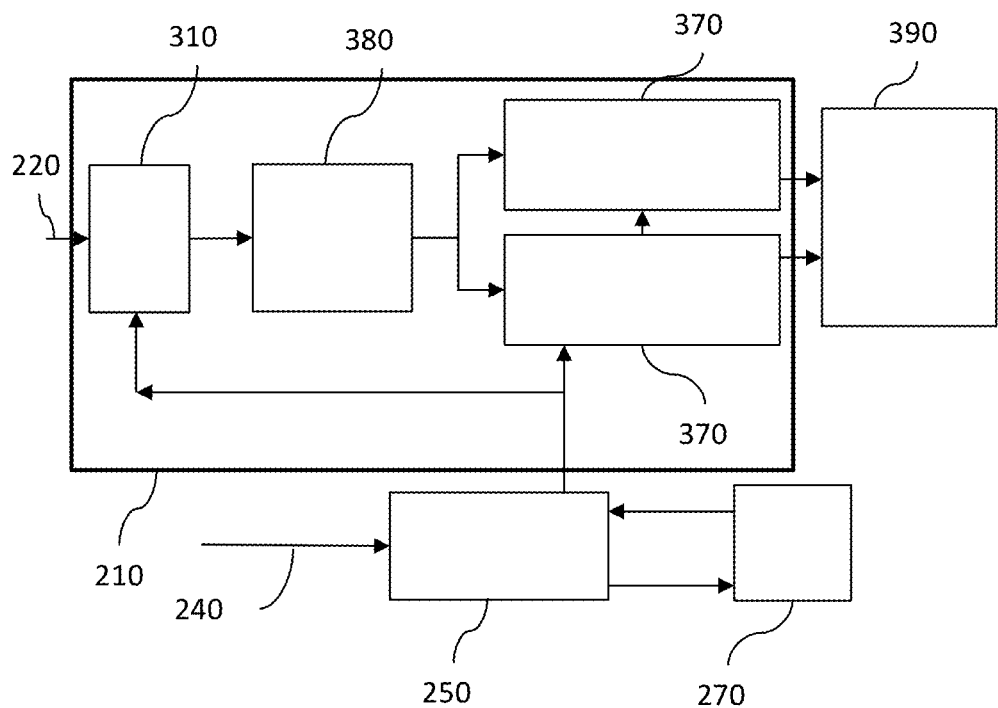
FIG. 3b is a simplified block diagram illustrating an amplifier subsystem implemented with a differential antenna, in accordance with certain aspects of the present disclosure.
Figure 3C:
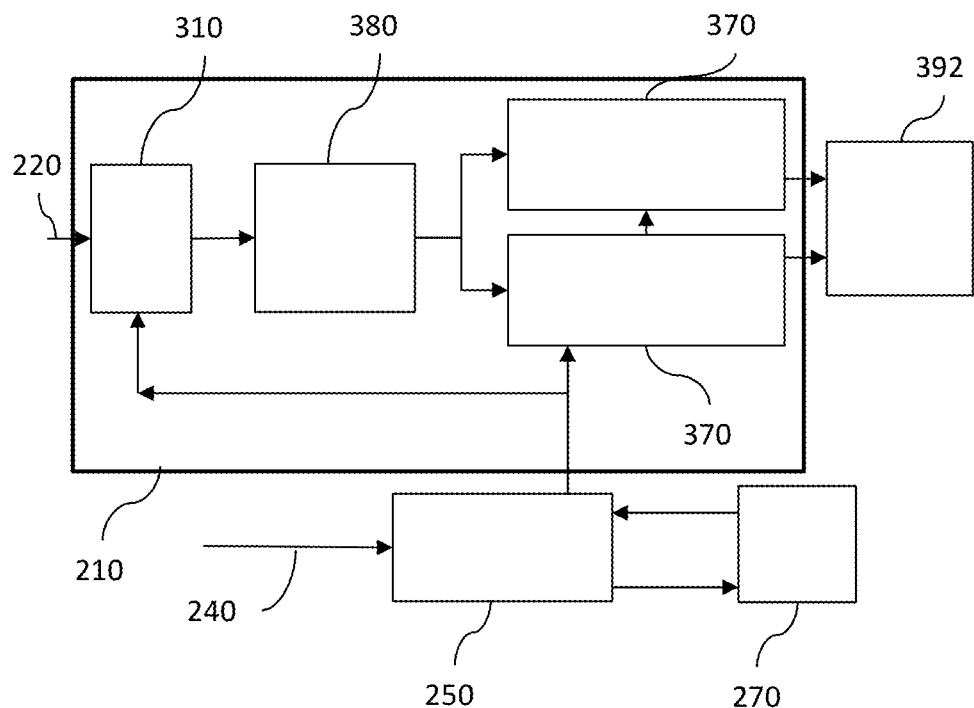
FIG. 3c is a simplified block diagram illustrating an amplifier subsystem implemented with an antenna array, in accordance with certain aspects of the present disclosure.
Figure 3C:
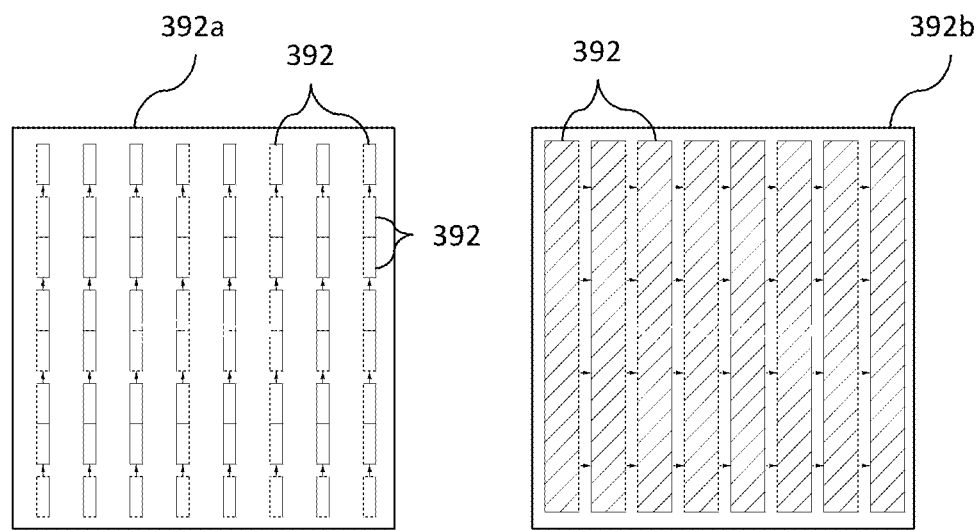
Figure 3D:
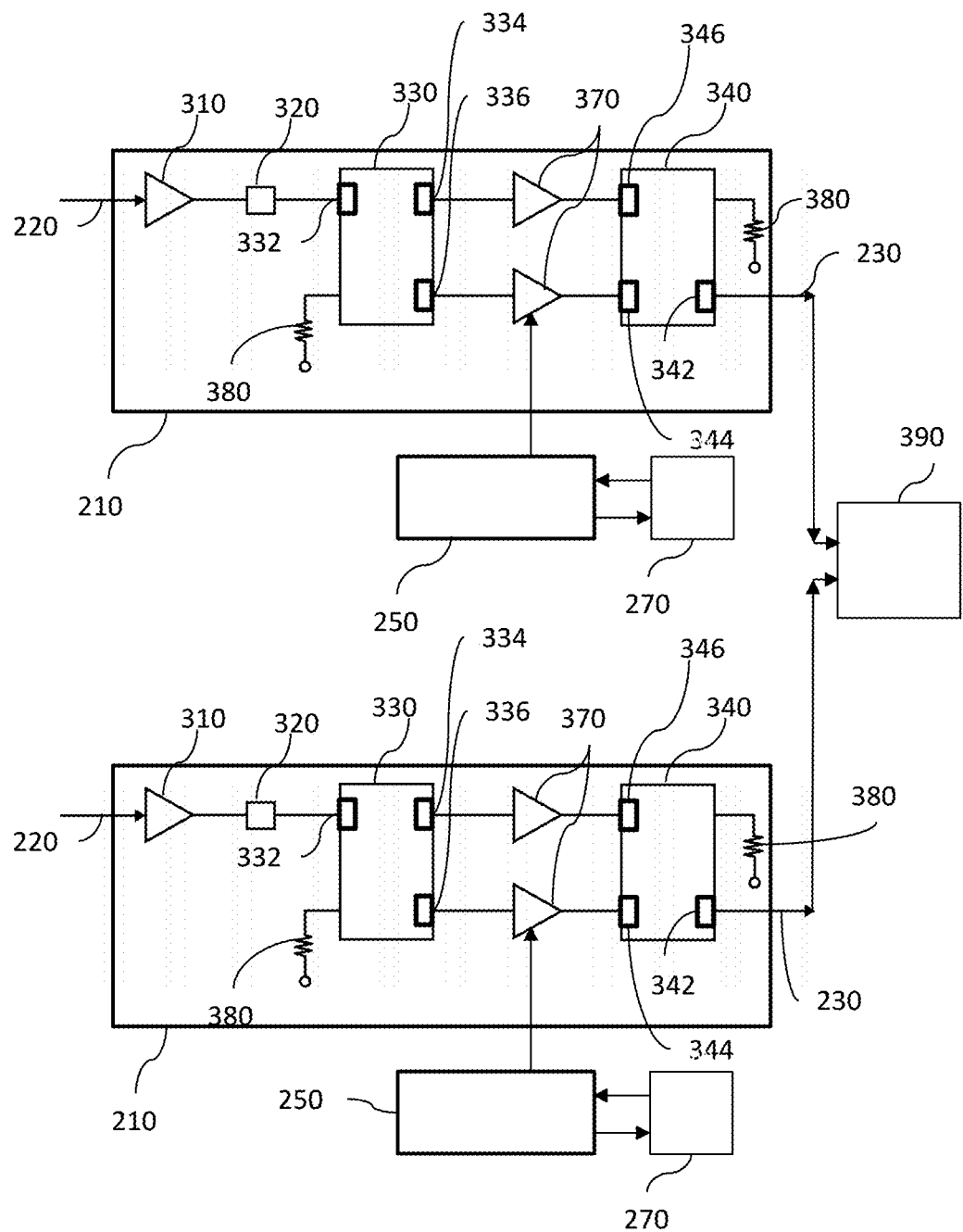
FIG. 3d is a simplified block diagram illustrating multiple amplifier subsystems implemented with a differential antenna, in accordance with certain aspects of the present disclosure.

FIGS. 3b-3d illustrate embodiments utilizing a differential antenna with certain aspects of the present disclosure. FIG. 3b illustrates an exemplary power amplifier subsystem having a splitter 380 configured to split an RF signal into a first RF component and a second RF component. Such a splitter can be configured to split the RF signal into two RF components of varying amplitude (e.g., a 50/50 splitter, 70/30 splitter, etc.). The system can further include a first high-power amplifier 370 configured to amplify and output the first RF component and a second high-power amplifier 370 configured to amplify and output the second RF component. The high-power amplifiers 370 in FIGS. 3b-d can be similar to other high-power amplifiers disclosed herein (e.g., high-power amplifier 370 as discussed with reference to FIG. 2).

Differential antenna 390 can have a first input operatively connected to the first high-power amplifier to receive the first RF component and a second input operatively connected to the second high-power amplifier to receive the second RF component. In some embodiments this embodiment can reduce the number of (or eliminate entirely) the need for combining circuitry. In any of the disclosed implementations, the differential antenna can be a high-impedance low-profile planar aperture 392. A number of such high-impedance, low-profile apertures 392 can be implemented to form an array such as a connected dipole array 392a, or its conjugate, a long-slot array antenna 392b with orthogonal polarization, as also illustrated in FIG. 3c. The connected dipole array can include gaps having an approximately 300-ohm gap impedance (denoted by the arrows between various high-impedance, low-profile apertures 392). The long-slot array antenna 392b can include an array of long slots excited at Nyquist interval by differential amplifiers. One advantage of such designs is eliminating the need of a conventional balun, and hence reducing the depth of the array antenna and the front-end RF loss.

FIG. 3d illustrates how the previously disclosed amplifier subsystems 210 can be utilized with a differential antenna. Here, a modular power amplifier can have two power amplifier subsystems. Each power amplifier subsystem can include a first 90 degree hybrid block configured to receive an RF signal and output a split RF signal with components having a 90 degree phase shift, a high-power amplifier configured to amplify at least one of the components of the split RF signal, and a second 90 degree hybrid block configured to receive, combine, and output the split RF signal by removing the 90 degree phase shift. Similar to the implementations in FIGS. 3b,c, a differential antenna can be configured to receive the output of the second 90 degree hybrid blocks of the two power amplifier subsystems.

Figure 4:
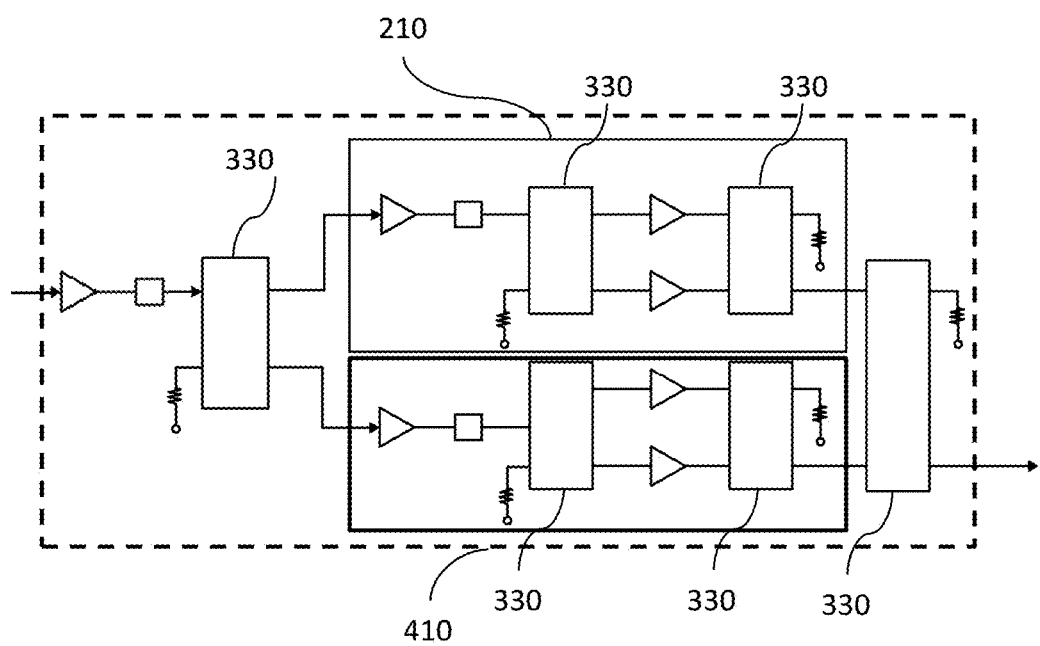
FIG. 4 is a simplified diagram illustrating the combining of amplifier subsystems into a scaled power amplifier assembly, in accordance with certain aspects of the present disclosure.

FIG. 4 illustrates how implementations of the present disclosure can allow the formation of a scaled power amplifier assembly 410 that combines multiple amplifier subsystems into a circuit equivalent to a single amplifier subsystem but having increased gain. In the example of FIG. 4, two power amplifier subsystems are shown, each including the first hybrid block and the second hybrid block. However, these power amplifier subsystems 210 are integrated into scaled power amplifier assembly 410 where they have replaced the intermediate power amplifier(s) in another power amplifier subsystem to form the scaled power amplifier assembly 410. Such scaling can be extended to combine any number of power amplifier subsystems in a scaled power amplifier assembly (that may itself be made up of scaled power amplifier assemblies). While the implementation in FIG. 4 illustrates the combination of three power amplifier subsystems, any number of power amplifier subsystems can be utilized, for example, 2, 4, 5, 6, 10, etc.

Figure 5:
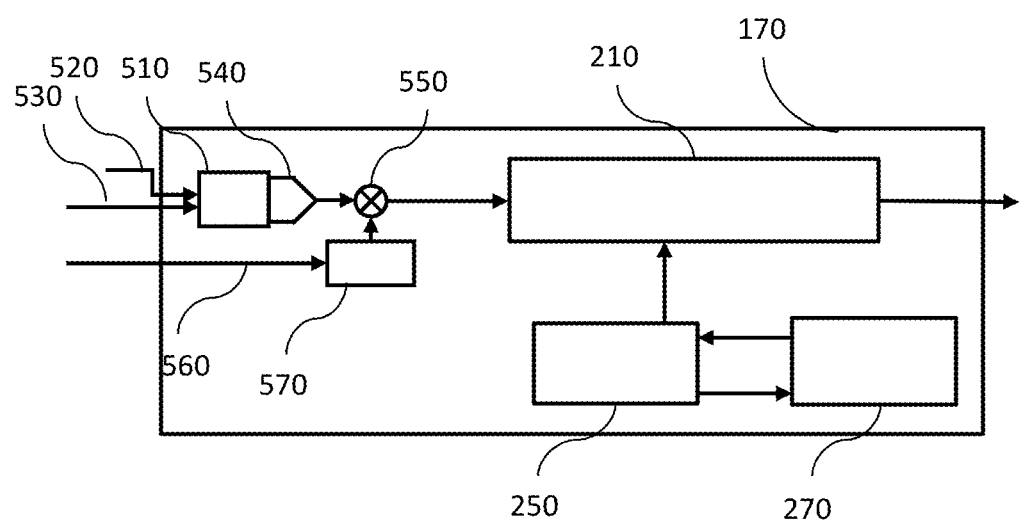
FIG. 5 is a simplified block diagram illustrating the generation of RF signals for amplification, in accordance with certain aspects of the present disclosure.

In some embodiments, as shown in FIG. 5, the waveform generation circuitry is embedded into the modular power amplifier 170 itself instead of having a radio frequency signal be provided as input to the modular power amplifier. This is a distributed method of waveform generation where a digital command is provided to the input of the modular power amplifier 170 instead of a radio frequency input. In some embodiments, the input 530 will contain a digital message with a phase offset value, amplitude, and a frequency value to command the module to transmit an RF waveform with the specified waveform and phase offset. These commands can also become more complex such as a series of commands such that the amplitude, phase offset and frequency vary as a function of time. A clock sync signal 520 can be input that originates at a common source such as a master clock with the purpose of synchronizing multiple modular power amplifiers so they can transmit commands phase-coherently to one another. This clock sync pulse can be used to align the digital clocks within the module to the sync pulse. The phase locked loop (PLL) sync clock 560 can be input into a PLL circuit 570 such that the PLL circuit 570 provides the clocking to the rest of the module and synchronizes with the PLL input 560 as another mechanism to synchronize the clocks. In some embodiments, an FPGA 510 and digital to analog converter 540 receive digital commands and the clock synchronization signal and translate the digital commands into a radio frequency signal for the power amplifier subsystem. In other embodiments, a direct digital synthesizer (DDS) chip is used instead of an FPGA and a DAC. In some embodiments, the RF signal generated from the DAC 540 is a sufficiently high frequency and is converted to the desired RF frequency by the DAC and input into the modular power amplifier 210. In other embodiments the DAC 540 outputs an intermediate frequency (IF) which is upconverted using a mixer subsystem 550 to the final desired frequency. There are multiple ways the mixing can be done, such as homodyne mixing, heterodyne mixing, etc.

Figure 6:
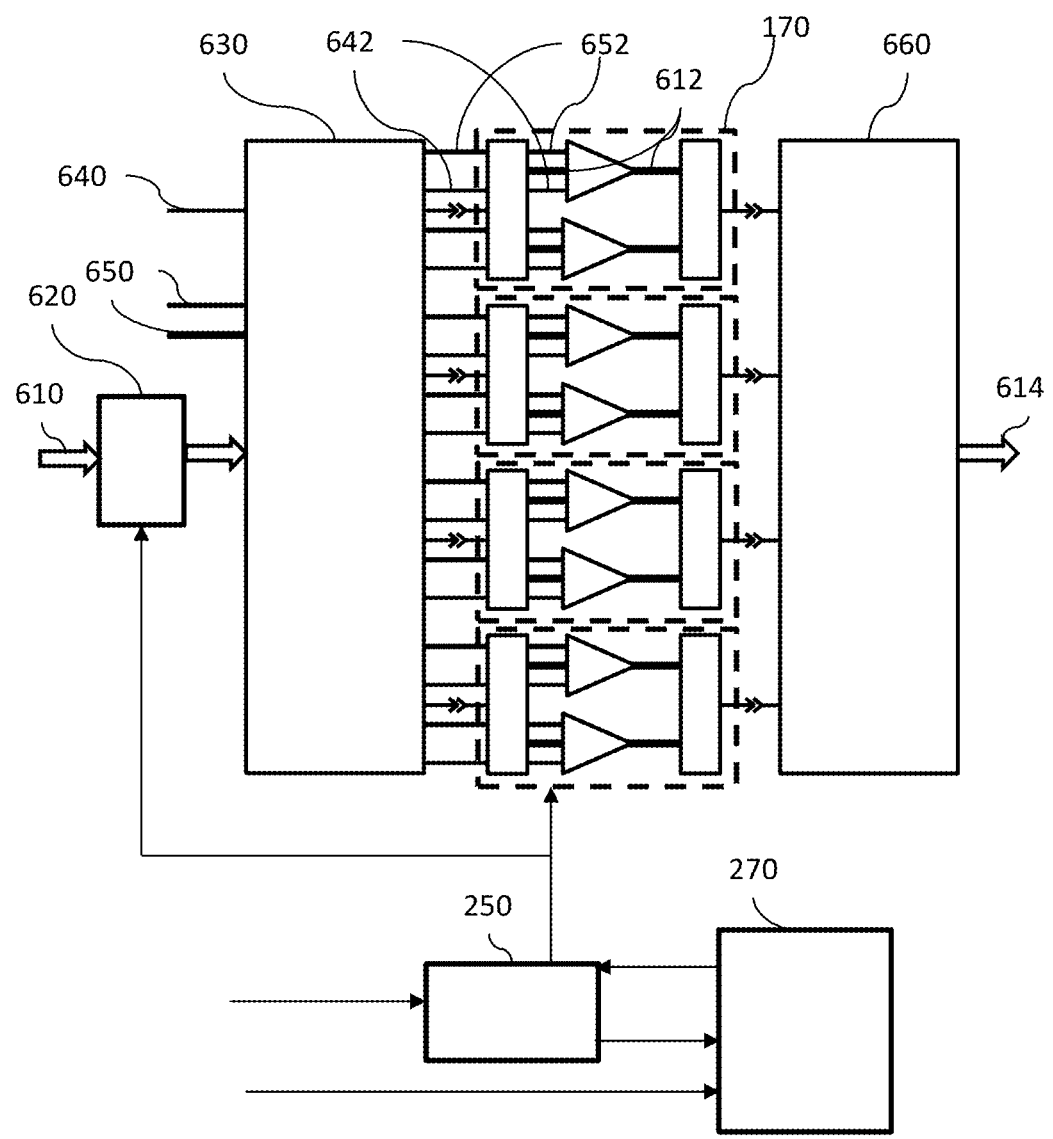
FIG. 6 is a simplified block diagram illustrating a parallel amplifier system, in accordance with certain aspects of the present disclosure.

As illustrated in the example of FIG. 6, the modular aspects of the disclosed amplifier systems can be utilized in a parallel configuration to provide high-gain amplification of an RF input signal 610. In some implementations, a driver amplifier 620 can receive the RF input signal 610 and provide an RF output to a power divider 630. The power divider 630 can be coupled to modular power amplifiers 170 arranged in parallel and configured to receive and amplify respective RF signals from the power divider 630. Optionally, the power divider can receive control signals 640 to control the splitting of the RF input signal. Also, the power divider can have various power channels 650, including inputs and/or returns for AC and/or DC power. The power divider 630 can be a Wilkinson power divider or other circuit that divides the incoming signal power evenly between multiple output channels.

The illustrated examples of modular power amplifiers 170 can be substantially similar to any of those described throughout the present disclosure. However, also shown in the implementation of FIG. 6 are control channels 642 (e.g., for providing control signals to the modular power amplifier 170 and its various components), power channels 652 (e.g., for providing power to various modular power amplifier components), and RF channels (e.g., for directing RF between various power amplifier components).

In some implementations, illustrated for example in FIG. 6, a high-power combiner assembly 660 can be coupled to the modular power amplifiers 170 and configured to combine respective RF output signals from the modular power amplifiers 170. The power combiner assembly can be a Wilkinson power combiner, radial power combiner, or Gysel power combiner. In this way, a single, greatly amplified RF output signal 614 can be generated.

As used herein, the term "parallel" can mean geometrically parallel (e.g., disposed in parallel planes) or electrically parallel (e.g., not in series). For example, the block diagram illustrated in FIG. 6 shows how the disclosed system has aspects that are electrically parallel, but not necessarily geometrically parallel. An example implementation having aspects that are specifically not geometrically parallel is shown in FIG. 7, below, where some of the generally planar amplifier circuits are oriented orthogonally to each other.

Figure 7:
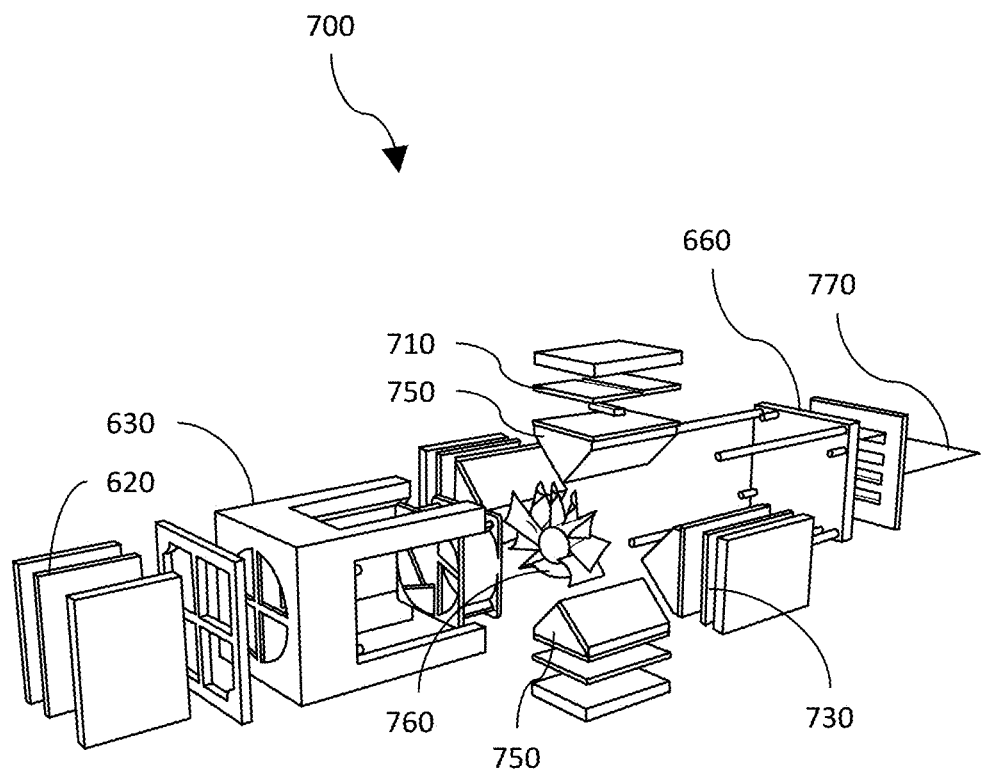
FIG. 7 is a simplified block diagram illustrating a 3D power amplifier, in accordance with certain aspects of the present disclosure.

FIG. 7 illustrates an implementation with a 3D configuration of amplifiers having the benefits of, for example, reduced electromagnetic interference, efficient use of space, and access to cooling mechanisms. As shown in FIG. 7 one implementation of a three-dimensional power amplifier 700 can include a first modular power amplifier 710 configured to receive a first RF signal and output a first amplified RF signal. The three-dimensional modular power amplifier 700 can also have a second modular power amplifier 730 configured to receive a second RF signal and output a second amplified RF signal. In some embodiments, RF input signals can be received by 90 degree hybrids (which may be similar to the 90 degree hybrid 330 in FIG. 3a). RF signals can be similarly power combined into another 90 degree hybrid output block (which may be similar to the 90 degree hybrid 340 in FIG. 3a). Various implementations can have the second high-power amplifier 730 can have a different orientation than the first high-power amplifier 710. Thus, the different orientations can cause a reduction in electromagnetic interference between the first high-power amplifier and the second high-power amplifier. Also, antenna 770, for three-dimensional power amplifier 700, can optionally be part of antenna array 190 depicted in the implementation of FIG. 1.

As used herein, the term "orientation" refers to an orientation of the high-power amplifier in 3D space. For example, the high-power amplifier may be a somewhat planar circuit oriented generally horizontally. As described above, a different high-power amplifier may have a different orientation (e.g., generally vertically). Because such high-power amplifiers may generally be of substantially similar construction, it would be understood by a person of skill what it means to have two high power amplifiers have different orientations. Furthermore, while the present disclosure contemplates that high-power amplifiers may have different orientations, this can also include other circuitry (besides the high-power amplifiers) such as the 90° hybrids, splitters, FPGAs, etc. Any combination of the components disclosed herein that are associated with a given high-power amplifier can thus have a particular orientation which may be different than any other combination of components associated with another high-power amplifier.

Some implementations can include the first high-power amplifier and/or the second high-power amplifier being of generally planar construction and the generally planar amplifiers can have different orientations. Accordingly, in some implementations, the first high-power amplifier and the second high-power amplifier can be constructed on printed circuit boards and disposed to have the different orientations.

The present disclosure contemplates the non-parallel orientations of these high-power amplifiers can mitigate electromagnetic interference between the amplifiers by, for example, reducing interference (constructive or destructive). When the present disclosure notes that two amplifiers are "not in the same plane," this means that they are non-coplanar but may be in parallel planes. When high-power amplifiers (or other circuitry) has the same orientation, metal shielding can be included around one or more locations to mitigate EMI. In some embodiments, some portions of the disclosed system can have high-power amplifiers parallel to each other, either vertically or horizontally. This can be in combination with any non-parallel arrangements of circuits, as discussed below and elsewhere herein.

As shown in FIG. 7, the different orientations can have an angle of 90 degrees between them to form a portion of a square (or rectangular) distribution of high-power amplifiers. Orienting at a 90 degrees angle around a heat sink, (such as a piece of metal or a fan) also helps to ease thermal constraints and remove heat.

In other implementations, the different orientations can have an angle of 120 degrees between them to form a portion of a hexagonal distribution of modular power amplifiers. In yet other implementations, the different orientations can have an angle of 60 degrees between them to form a portion of a triangular distribution of modular power amplifiers. In general, any geometric distribution of modular power amplifiers is contemplated, further including parallelograms or other polygonal or irregular shapes. In this way, most generally, the present disclosure contemplates that at least two of the power amplifiers may not be geometrically parallel, for at least the above-described benefits of heat removal and reduction of EMI.

As shown in FIG. 7, in other implementations, there can be a third high-power amplifier having an orientation substantially perpendicular to the first high-power amplifier and a fourth high-power amplifier having an orientation substantially perpendicular to the second high-power amplifier. Such a configuration is similar to the square distribution described above, but also includes parallelogram-shaped distributions.

As discussed, the disclosed three-dimensional power amplifier has several technical advantages, including improved cooling due to the ability to of, for example, generally planar modular power amplifiers, to have their planes facing a cooling element. This can expose an increased surface area to a cooling element and thus improve cooling. Cooling elements can include, for example, a heat sinks, fans, etc. with number and any sort of cooling element implemented. As shown in FIG. 7, there can be a cooling component (e.g., heat sink 750) located proximate to the first high-power amplifier or the second high-power amplifier. Also, a fan 760 can be included to provide direct air cooling over the amplifier circuitry and heat sinks.

The amplifier designs contemplated herein provide improved mitigation of electromagnetic interference. In some implementations, this can include providing electromagnetic shielding between the first high-power amplifier and the second high-power amplifier. Such electromagnetic shielding can include, for example, Faraday cages, RF absorptive foam, RF reflective materials, etc. In some implementations, such shielding can be located around or between modular power amplifiers.

Some implementations can provide further mitigation by virtue of the separation between any adjacent parallel modular power amplifiers. For example, the first high-power amplifier and the second high-power amplifier can be configured to receive the first RF signal and the second RF signal, both signals having a wavelength, and the first high-power amplifier and the second high-power amplifier are separated by at least approximately half of the wavelength. In some embodiments, the amplifiers can be separated by less than half a wavelength. Such arrays can be challenging to integrate from a mechanical packaging standpoint due to the tight spacing, but can provide higher power per unit area. In other embodiments, the modular power amplifiers are separated by more than half a wavelength. Any spacing more than half a wavelength can cause a smaller grating-lobe free field of regard. At a half-wavelength spacing, a beam can be scanned over a 180 degree field of regard from the array. As the spacing increases up to lambda (the wavelength), the grating lobe free field of regard is reduced. In one a 0.7 lambda spacing can be used, which allows more space to fit the modules but also allows a larger area for the antenna array. As the gain is related to the area of the antenna array, moving out the modules enables higher gain. Separations can include, for example, 1-8 inches, which can be appropriate for some L-band and S-band phased array applications. Other separations are contemplated, based on the wavelength of the RF being amplified, as discussed above, or other separations that act to mitigate interference. In some implementations, the wavelength used is the wavelength of the highest frequency being used in the design.

Figure 8:
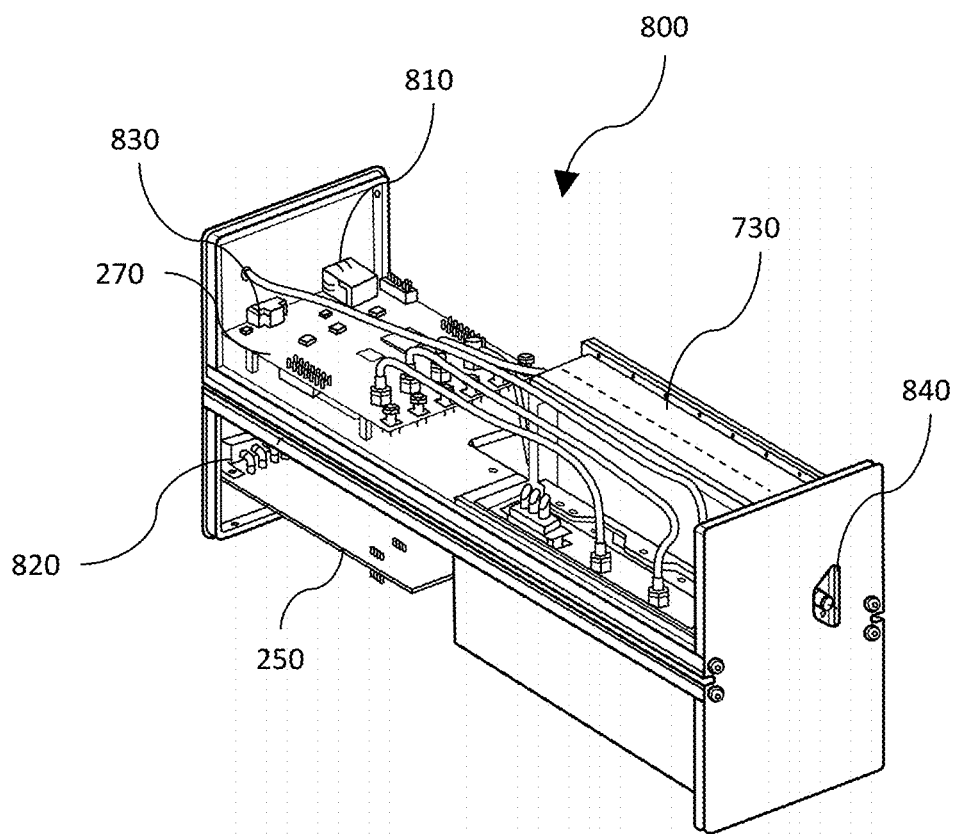
FIG. 8 is a simplified diagram illustrating modular power amplifier, in accordance with certain aspects of the present disclosure.

As shown in FIG. 8, an exemplary modular power amplifier 800 can include many of the components disclosed herein, allowing, for example, efficient replacement of damaged or upgraded modules. For example, the modular power amplifier 800 can include an RF input port 810, a power input port 820, a digital control port 830, and an RF output port 840. Such ports simplify the connections needed to operate and maintain the amplifier system.

Figure 9:
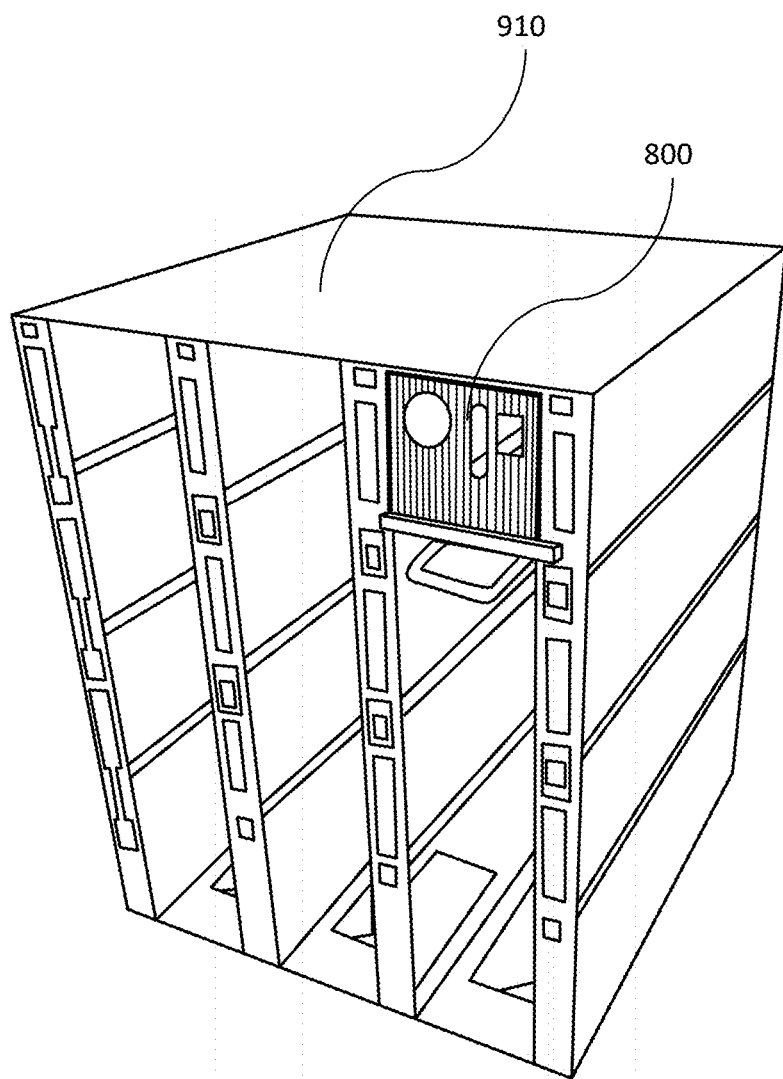
FIG. 9 is a simplified diagram illustrating a rack for multiple modular power amplifiers, in accordance with certain aspects of the present disclosure.

FIG. 9 illustrates an exemplary rack 910 suitable for holding one or more modular power amplifiers 800. The rack 910 can be a lattice-shaped structure configured to receive any number of modular power amplifiers. Rack 910 can include guides and spacers between installed modular power amplifiers to enable the proper alignment and spacing to enable various improves disclosed herein, such as required wavelength separations or incorporating shielding into the structure of the rack for further EMI mitigation.

Figure 10:
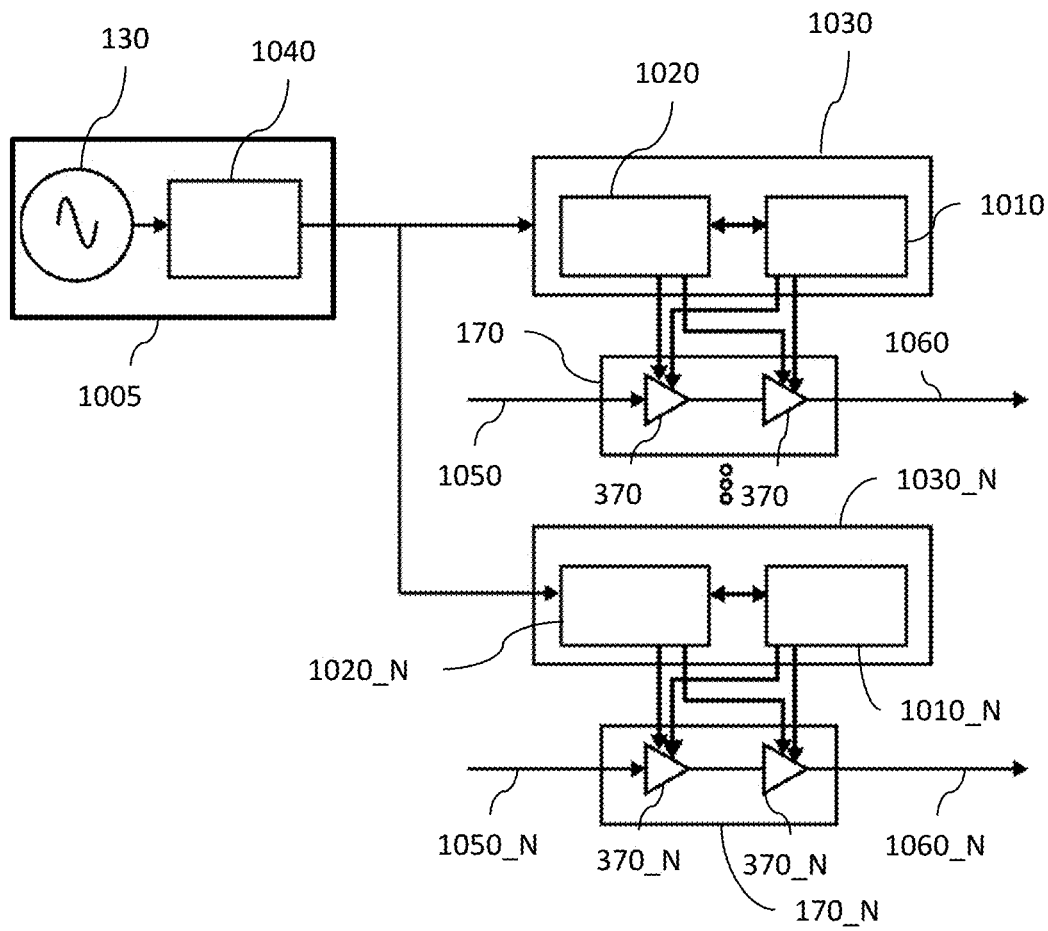
FIG. 10 illustrates an exemplary distributed power system utilizing a "Point of Load" (PoL) power distribution unit (PDU), in accordance with certain aspects of the present disclosure.

FIG. 10 illustrates an exemplary distributed power system utilizing a "Point of Load" (PoL) power distribution unit (PDU). In the illustrated implementation, a plurality of loads 170, . . . 170_N are powered by an associated PoL PDU unit 1010, . . . , 1010_N respectively. The plurality of PoL PDU unit 1010, . . . , 1010_N are connected to a common power source 1005. The number of loads 170, . . . , 170_N can be between 2 and 20 in various implementations. In electrical systems (e.g., RF systems, electrical charging systems, directed energy systems) the plurality of loads 170, . . . 170_N can comprise semiconductor devices, such as, for example, amplifiers and/or switches. The plurality of PoL PDU units 1010, . . . , 1010_N are configured to receive power from the power source 1005 and convert the received power to voltages and currents that are required by the load 170, . . . 170_N to which they are connected. Accordingly, the PoL PDU 1010 is also referred to herein as a "power converter." Without any loss of generality, power converter 1010 can be similar to power distribution unit 140 in FIG. 1, but advantageously located closer to its respective load, as described further herein. FIG. 10, as well as other figures herein, has some elements with the subscript_N appended. It is understood that when reference is made to an element that does not have that subscript that the description applies to the "Nth" element as well, as such is taken to be substantially identical.

In some embodiments, the modular power amplifiers 170, . . . , 170_N can include at least two high power amplifiers (HPAs) 370 which are configured to amplify input signals in a frequency range of DC to about 20.0 GHz. In some implementations, each HPA may be configured to provide 10-80 dB of gain for signal. In other implementations, the HPAs 370 may provide different amounts of gain. In various implementations, the HPA 370 can comprise a FET amplifier, e.g., a GaN FET amplifier. The power converter 1010 can be configured to provide the driving voltages and current to the gate and drain terminal of the FET amplifier that will turn on/off the amplifiers. For example, the power converter can be configured to provide DC voltages in a range between about 20 Volts and about 100 Volts and DC currents in a range between about 0.5 Ampere and about 60 Ampere.

As depicted in FIG. 10, various embodiments can comprise a distributed power system configured to provide power to multiple loads (e.g., amplifiers 370). The distributed power system can include power converters 1010 configured to receive DC power from a common power source 1005. In some implementations, for example, the common power source can comprise the AC power supply 130. As described further herein, the power converters can be configured to provide DC power to a corresponding load. In some implementations, the common power source 1005 can comprise a battery.

In certain embodiments, such as depicted in FIG. 10, the power converters can be positioned proximal to the corresponding load that it powers. Such positioning can provide numerous technical benefits, such as reduced parasitic capacitance, reduced inductance from long wires or lead lines, as well as efficient use of the available circuit volume. In this way, the power converters can be integrated with the corresponding load. In some embodiments, the power converters can be integrated with the corresponding load on a common substrate. The common substrate can include a printed circuit board (PCB). Accordingly, in certain embodiments, the power converters can be connected to the corresponding load by a printed circuit board (PCB) trace (e.g., a conductor embedded into the PCB). For certain embodiments (which may not utilize a PCB) similar technical benefits relating to a reduction in parasitic capacitance can be realized by, for example, the power converters being connected to the corresponding load by a wire having a length less than about 5 inches, less than about 4 inches, less than about 3 inches, less than about 2 inches, less than about 1 inch, etc.

Figure 11:
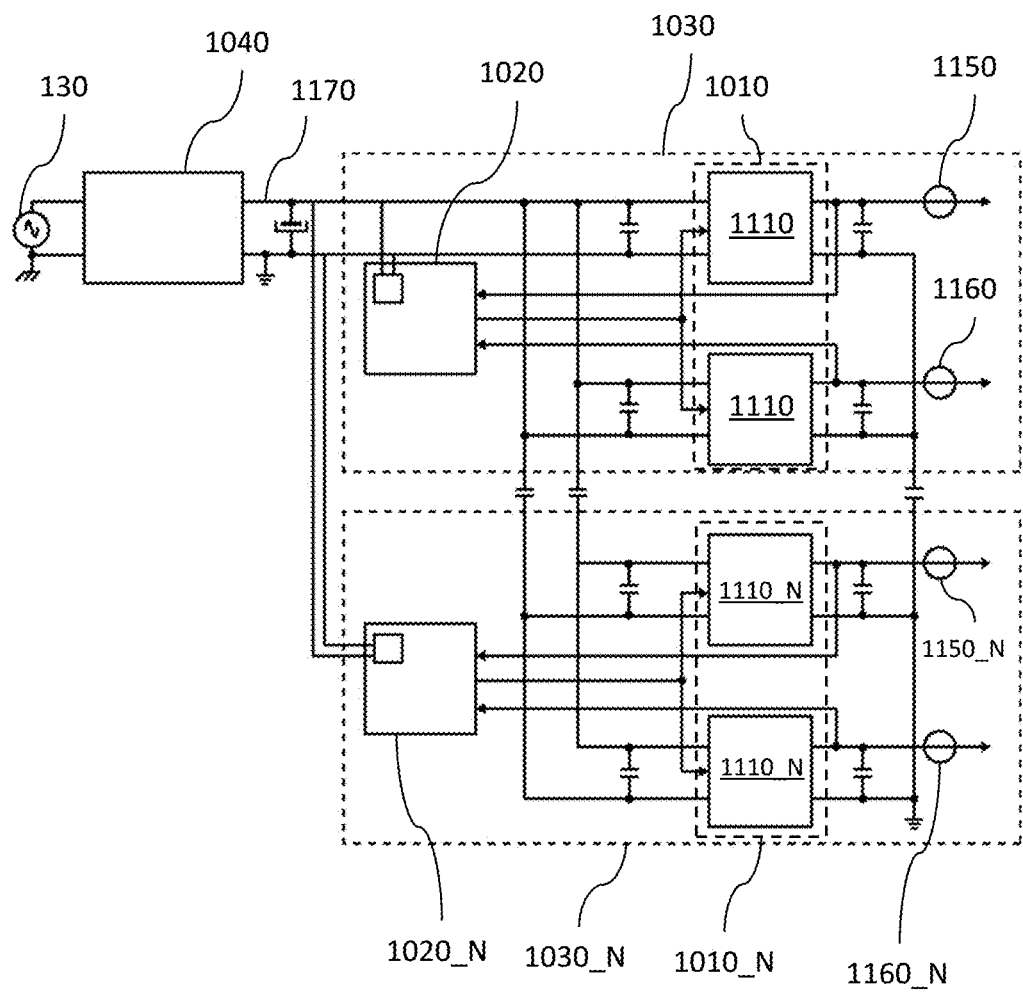
FIG. 11 illustrates an exemplary distributed bus architecture for a power distribution system, in accordance with certain aspects of the present disclosure.

In certain embodiments, the common source can include an AC-DC converter 1040 shown in FIG. 11. The AC-DC converter 1040 can be configured to receive power from AC power source 130 and convert to DC power. In other embodiments, such an AC-DC converter may not be present, for example, when the common source includes a battery or a generator that provide DC power.

In some embodiments, the system can include a bias controller 1020 that can be configured to (i) turn on/off the amplifiers by raising the gate voltage to a value above a threshold value which will turn on the amplifier/lowering the gate voltage to a value below the threshold value that will turn off the amplifier; and/or (ii) intermittently offsetting the gate voltage in response to a sensed current value of the amplifier to optimize the efficiency of the amplifier.

Power converter 1010 and bias controller 1020 can be collectively referred to as amplifier driver 1030. Amplifier driver 1030 can thus receive input power from AC/DC converter 1040 which may be configured to convert AC power from power supply 130. Amplifier driver 1030 may thus control the amplification of RF input 1050 by the modular power amplifier 170. The amplified RF signal may then be output from modular power amplifier 170 as RF output 1060.

FIG. 11 illustrates an exemplary distributed bus architecture for a power distribution system. As depicted in FIG. 11, AC line voltage from power supply 130 can be converted by AC/DC converter 1040 to a DC voltage in the range of, for example, about 10-100 Volts. The output of the AC-DC converter 1040 can be to a distributed DC bus 1170 which can be input to a number of DC-DC converters 1110 that can provide further rectification. For example, the converters 1110 can step-up or step-down the DC voltage received from the DC nus 1170 to voltages required by the corresponding load connected to the output of the converters 1110. For example, in some implementations, each of the DC-DC converters 1110, . . . 1110_N can be connected to a corresponding modular power amplifier (e.g., power amplifiers 170) comprising one or more HPAs that are driven by the DC-DC converter. As previously described, the modular power amplifiers connected to each of the DC-DC converters can be a part of a phased array. The DC-DC converters can be part of the power converter and thus can be positioned close to a corresponding modular power amplifier (or the load which is being powered) thereby avoiding/eliminating long wiring distances that are used in conventional systems to power amplifiers. The DC-DC converter 1110 can take the distributed bus (also referred to herein as DC bus 1170) voltage and convert it to the power required for driving the modular power amplifier. In various implementations, the DC-DC converter can be configured to meet the highest power consumption requirements of the system.

In the implementation illustrated in FIG. 11, the distributed power system provides power for two HPAs of a modular power amplifier. A first HPA of the modular power amplifier may be powered by drive voltage 1 1150 and a second HPA of the modular power amplifier may be powered by drive voltage 2 1160. In various implementations, Drive voltage 1 can have a value between 60-70 Volts and Drive voltage 2 can have a value between 45-55 Volts. The bias controller 1020 can also derive power from the DC bus as shown in FIG. 11. The bias controller can comprise a step-down converter for the higher DC voltage such that it provides the required voltages for the bias controller. This architecture is discussed below in greater detail with reference to FIG. 13.

Figure 12:
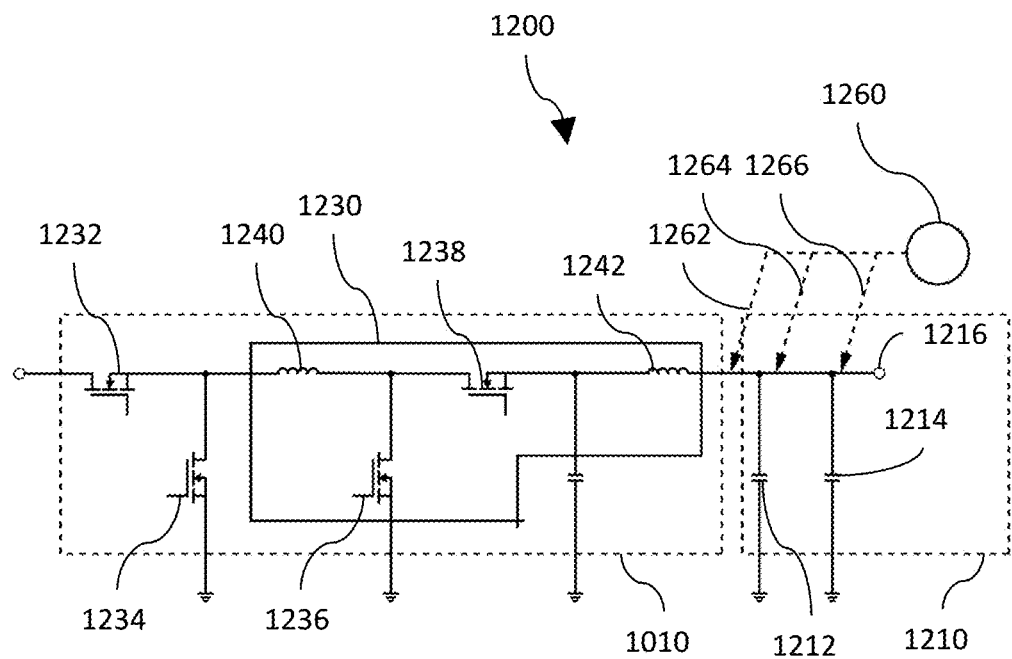
FIG. 12 illustrates a power converter, in accordance with certain aspects of the present disclosure.

FIG. 12 illustrates a power converter 1200. Power converter 1200 can be utilized to improve the performance of the high-power amplifiers 370 and, in general, of the modular power amplifier 170. Per regulator 1200 can provide an amplifier capacitance 1210 that improves the operation of the amplifiers. Power converter 1200 can also include a limiter 1220 configured to provide protection (e.g., against current/voltage spikes or dips) of various circuits in the disclosed systems.

As discussed above, the disclosed distributed power systems can power a load comprising an amplifier. The power converter providing power to the amplifier can include an output filter to regulate power provided to the amplifier. As described in further detail below, the output filter can comprise a capacitor associated with the amplifier.

To increase speed and power efficiency of the amplifiers, the amplifier capacitance can be implemented utilizing the output filter as a split capacitor system that may be an integrated part of the power converter. The output filter 1210 can split the amplifier capacitance into two (or more) parts: a slow/bulk capacitance (realized at least by a bulk capacitor 1212) used to provide enough energy to support operation of the modular power amplifier in a pulsed mode, and a fast capacitance (realized at least by a fast capacitor 1214) used to provide initial load demand and improve high-frequency regulator response. Such split capacitance can thus further regulate the voltage/power delivered to the modular power amplifier. In some specific embodiments, output 1216 (from the fast capacitor and the bulk capacitor) can be delivered to a drain terminal of a high-power amplifier. This configuration also has the technical benefit of efficiently using the available space on the circuit board.

Without relying on any particular theory, the bulk capacitor 1212 can comprise an electrolytic capacitor having an equivalent resistance less than about 50 milliohms, and the fast capacitor 1214 can comprise a ceramic capacitor having an equivalent resistance less than 1 milliohms. The bulk capacitor 1212 has a slower charging/discharging time as compared to the fast capacitor 1214. In a pulsed systems, the fast capacitor 1214 can provide the required power/current to amplify a pulse during the initial rise time of the pulse and the bulk capacitor 1212 can provide the required current/power during the remaining duration of the pulse. For example, the fast capacitor 1214 can provide the required current/energy during the initial few 100 s of nanoseconds of a pulse and the bulk capacitor 1212 can provide the required current/energy for the remaining duration of the pulse.

Thus, in some embodiments, the distributed power system can implement the capacitor(s) associated with the amplifier by including a bulk electrolytic capacitor used to provide enough energy to support operation of the amplifier in a pulsed mode, and a fast ceramic capacitor used to provide initial load demand and improve high-frequency regulator response.

The split capacitor system can therefore include a fast capacitor and a bulk capacitor. The system can be configured such that the bulk capacitor has a slower response and more energy storage than the fast capacitor. The fast capacitor can be a ceramic capacitor and the bulk capacitor can be an electrolytic capacitor.

In use, the amplifier can be configured amplify RF signals in a pulsed mode. Here, an initial portion of the current needed for an RF pulse can be delivered to the amplifier by the fast capacitor.

In certain embodiments, the fast capacitor can be configured to provide more current than the bulk capacitor in response to a voltage change across the fast capacitor and the bulk capacitor when the voltage change is over 100 MHz.

As with many embodiments of the present disclosure, the disclosed systems are scalable. As such, certain embodiments may include, for example, a second amplifier a second split capacitor system that reduces voltage and/or current variations between the first amplifier and the second amplifier. In this way, the stability of the overall amplifier system can be improved.

The implementation illustrated in FIG. 12 is configured as a step-up PoL converter/regulator employing a 4-switch step up/down limiter operating in a continuous conduction mode. Such an approach provides effective isolation between input DC bus voltage and individual amplifier voltages and is virtually fail-safe against short circuits since there is always inductance in the path of the main load current. In various implementations, the limiter can employ synchronous switches in the design to reduce the power dissipation across the switches and improve overall power efficiency. The limiter shown in FIG. 12 can be operated as a Buck limiter or a Boost limiter. In the Boost mode (step-up), switch 1234 is inactive and the switch 1232 is on. In this mode, the switch 1236 regulates the output voltage/current (e.g., via PWM switching) and the switch 1238 operates synchronously with the switch 1236. Thus, switch 1238 is off when 1236 is on and vice versa. In the Buck mode (step-down), switch 1238 is on and 1236 is off. Switch 1232 regulates the output voltage/current (e.g., via PWM switching) and 1234 operates synchronously with 1232. Thus, switch 1234 is on when 1232 is off and vice versa. The illustrated limiter can be a part of the DC-DC converter 1110 shown in FIG. 11.

The circuit in FIG. 12 thus comprises a limiter which is configured to limit the amount of power drawn by the amplifier. In various implementations, the limiter can be a current limiter that maintains a constant current across the inductor Lout. In some other implementations, the limiter can be a voltage limiter that maintains a constant voltage across the inductor Lout. In various implementations, the current/voltage limiter can be a programmable to limit the amount of current/voltage drawn by each amplifier. In the event of a short-circuited load (e.g., a load having a resistance of a few ohms or a few micro-ohms), the current/voltage limiter can prevent a current overload and reduce damage to the load.

Accordingly, in certain implementations, the distributed power system can be part of a phased array system with improved operation at least from utilization of the described limiter. Some implementations can have at least one of the power converters configured as a 4-switch step-up/step-down converter that can operate in a continuous conduction mode. As shown, at least one of the power converters can include synchronous switches. Accordingly, at least one of the power converters from the plurality of power converters can include a limiter configured to limit the amount of power drawn by the load.

In certain implementations, a system can include an amplifier and a limiter configured to limit the amount of power drawn by the amplifier, the limiter including inductors such that power through the limiter always passes through at least one of the plurality of inductors. In some embodiments, the limiter can be a voltage limiter configured to maintain a constant voltage across an output inductor through which an output current passes. In other embodiments, the limiter can be a current limiter configured to maintain a constant current across an output inductor through which an output current passes.

The limiter can provide electrical stability to the system by directing access currents to ground. For example, in certain implementations, the system can include an input inductor 1240 configured to receive an input current and a second switch 1234 connected between a first ground and an input of the input inductor. The system can be configured to open the second switch in response to an overvoltage or overcurrent status and thereby shunt the input current at least partially to ground. The system can also include an output inductor 1242 configured to receive an output current. A capacitor can be connected between the output inductor and a second ground. A third switch 1236 can be connected between the capacitor and an input inductor. The system can be configured to open the third switch in response to an overvoltage or overcurrent status and thereby shunt the input current at least partially to the capacitor. In some embodiments, the switches can be connected to a control system configured to open switches 1234 and 1236 synchronously in response to an overvoltage or overcurrent status.

Yet another innovative aspect includes utilizing the current sensor to sense the current output from the PoL converter and provide a cycle-by-cycle and/or average current limiting feature. The current sensor also provides other features, such as an almost instantaneous hardware short circuit protection to disable damaged/defective amplifiers and other electronic components in a phased array without affecting operation of the rest of the system to improve reliability and operability of the system. The decentralized topology provides an improved system fault protection as compared to a centralized power distribution architecture, since power faults become local to each phased array element and do not affect other elements. Further, power distribution becomes simpler and more efficient in the power system based on POL converters since only a single DC voltage rail may be required to be distributed within the system. Therefore, such distributed power systems can be scaled up in voltage and power to support increased power outputs of the RF amplifiers.

As illustrated in FIG. 12, power converters 1200 can include a sensor configured to sense a current or a voltage drawn by the load. Utilization of the sensor can include a programmable processor monitoring the sensor output and adjust an amount of current or voltage provided to the load. In various implementations, the current or voltage can be monitored at one or more different locations. For example, depicted in FIG. 12, current sensor 260 can be configured to monitor the circuit at a first sensing location 1262, a second sensing location 1264, and/or a third sensing location 1266.

In some implementations, the load can be a three-terminal amplifier having a gate terminal, a drain terminal and a source terminal, and the programmable processor can be configured to maintain a voltage to the gate terminal below a threshold voltage. For example, the power converters can be configured to provide voltage in a range from about 20V-100V to the corresponding load. As certain embodiments are implemented as arrays or otherwise having multiple amplifiers or loads, in certain implementations there may be between 4 and 12 loads or amplifiers.

Figure 13:
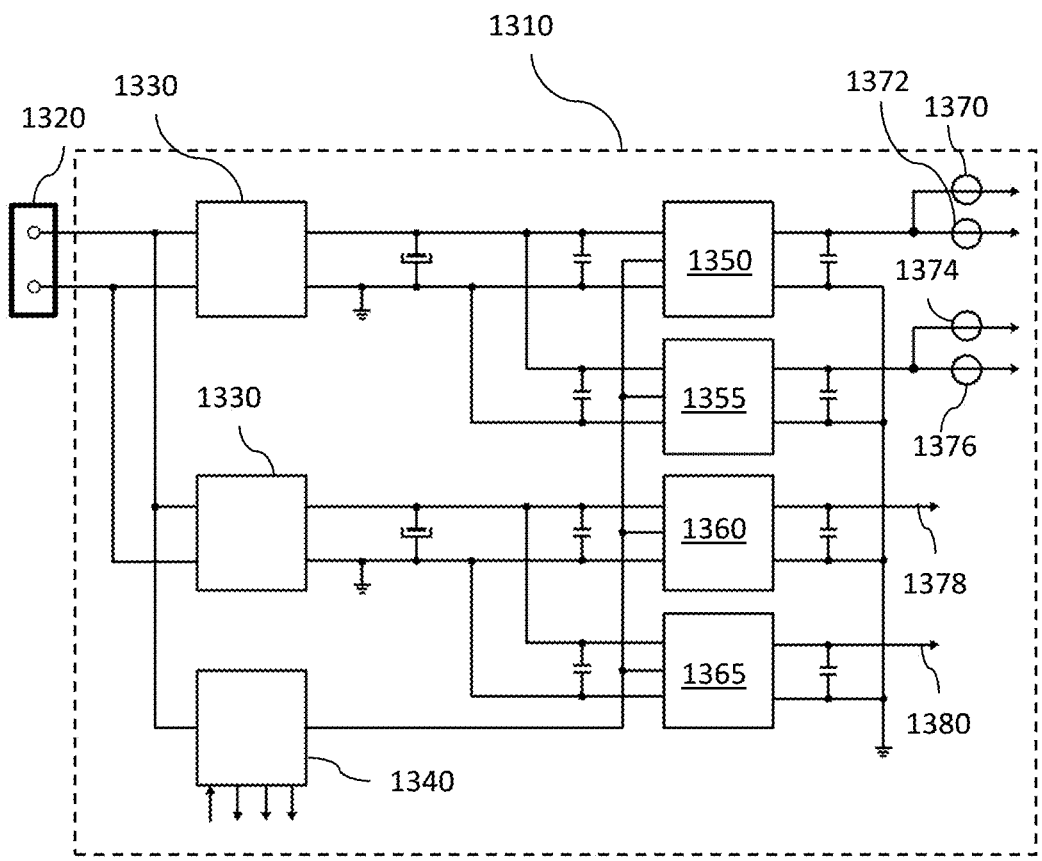
FIG. 13 illustrates a power distribution unit connected to a battery, in accordance with certain aspects of the present disclosure.

FIG. 13 illustrates an implementation of a PoL PDU 1310 connected to a battery 1320, in accordance with some embodiments. The PoL PDU 1310 can be configured to power a load (e.g., a modular power amplifier comprising 2 or more high-power amplifiers). The depicted circuit and components can be similar to the power distribution unit 1010 as described with reference to FIG. 10. Similar to FIG. 10, an array of PoL PDUs 1310 can be connected to the battery 1320. A limiter 1330, which may be the same as limiter 1230 in some embodiments, can facilitate the connection of the DC-DC converters 1350, 1355, 1360, and 1365 to the battery 1320. Converter 1350 can generate voltages 1370 and 1372 required to drive amplifiers connected to its output and converter 1355 can generate voltages 1374 and 1376 required to drive amplifiers connected to its output. In FIG. 13, there may be some situations where the battery is always on. In such situations, were the converters 1350 and 1355 be directly connected to the battery, there could be a current surge due to charging of the capacitors associated with the amplifiers powered by the converters 1350 and 1355. In such situations, the limiter 1330 can slow or prevent the current surge and reduce the risk of damage to the amplifier.

In some implementations, battery 1320 can be connected to the converters by a DC bus. In some implementations, the DC bus can be a +48V DC input line and +48V DC return line. The PDU can include a power sequencer 1340 that can be configured to execute a power sequencing safety algorithm to ensure the gate voltage to an amplifier is always the first on and last off in order to protect the amplifier. The DC-DC converters 1360 and 1365 can be configured to generate +12V output 1378 and −12V 1380 and can be based on a synchronous step-down regulator, for example similar to limiter 1230. The +12V and −12V output can be used to provide power to the bias controller discussed above. In various implementations, the converters 1350 and 1355 can be configured to provide the voltage at the drain terminal of a plurality of three-terminal semiconductor devices (e.g., a FET amplifiers) and the converters 1360 and 1365 can be configured to provide the voltage at the gate terminal of the plurality of three-terminal semiconductor devices. For example, the converters 1350 and 1365 can be configured to provide 65V and 50V respectively in some implementations. The architecture of the converters 1350 and 1365 can be similar to the step-up converter discussed above with respect to FIGS. 11 and 12.

In various implementations, the bias controller can raise a fault bit to alert the system to an overcurrent situation for each amplifier in a system (e.g., the driver amplifiers and the high-power amplifiers in the LRAM) in response to the sensed current/voltage. Amplifiers comprising Gallium Nitride (GaN) can malfunction if the gate voltage goes to zero, and the drain voltage is on. A GaN amplifier is an always on device and it can drive a large amount of current from the supply if the gate is at ground (or 0 Volts). Accordingly, in various implementations, a battery backup system may be provided to the bias controller which can maintain the gate voltage at appropriate voltage level (e.g., between −2V and −5V) as a protection system to maintain the 12V supply to the bias controller in the event of a power failure so that the amplifier gate voltage is always on.

The power distribution unit can include a current sensor and/or a voltage sensor that can monitor the driving current and/or voltage output to the amplifier. The PoL PDU can be configured to turn off the driving power to the amplifier if the current and/or the voltage is not within a range defined by an upper threshold limit and a lower threshold limit. This feature can safely disable amplifiers that are dead or defective and also prevent amplifier malfunctions.

Accordingly, some embodiments of the disclosed systems can include a battery, an amplifier powered by the battery, and a programmable processor that can be configured to perform various operations. Such operations can include monitoring, with a sensor, a gate voltage of the amplifier. The operations can also include determining that the gate voltage is not, or is expected not to be, in a range between an upper threshold and a lower threshold. The voltage can then be maintained to be within the range between the upper threshold and the lower threshold. In certain implementations, the range can be between −2V and −5V, but can also be between −1V and −5V, −3V and −4V, or any combination of negative voltages between −1 and −10V. Maintaining the voltage can also include drawing power from a battery backup system to maintain the gate voltage to be within the range. Some implementations can include an operation shutting off a supply voltage to the amplifier.

The bias controller in cooperation with the power distribution unit can execute other safety mechanisms, such as, for example, using "learning" about the power amp and other methods to set a gate voltage threshold such that smart power never brings the gate voltage above (less negative, such as never go above −2V) this safety threshold. Thus, the operations can further include determining, by a machine-learning algorithm, a gate voltage threshold that is the most positive voltage in the range.

There is also a safety mechanism that upon detecting the current, the RF input voltage to the amplifier can be limited to a certain level, because overdriving the amplitude of the RF input voltage can also cause the amplifier to malfunction. Accordingly, some implementations can include controlling the power sequencer to provide power to a bias controller to turn on or turn off the amplifier.

With the above disclosure, it is contemplated that aspects of the disclosed systems can be utilized for RF generation control numerous applications. For example, the improved ability to provide high-power RF can be utilized in static and/or vehicle-mounted systems. Similarly, such improvements can be utilized in UAV-mounted, backpack, and/or handheld systems. Accordingly, while some features are described in the context of a rack-mounted system, such features can be utilized in more compact designs.

In the following, further features, characteristics, and exemplary technical solutions of the present disclosure will be described in terms of items that may be optionally claimed in any combination:

Item 1: A distributed power system configured to provide power to a plurality of loads, the system comprising: a plurality of power converters configured to receive DC power from a common power source, each of the plurality of power converters configured to provide DC power to a corresponding load from the plurality of loads, wherein each of the plurality of power converters is positioned proximal to the corresponding load that it powers.

Item 2. The distributed power system as in Item 1 or any of the Items depending from Item 1, wherein each of the plurality of power converters is integrated with the corresponding load.

Item 3. The distributed power system as in Item 1 or any of the Items depending from Item 1, wherein each of the plurality of power converters is integrated with the corresponding load on a common substrate.

Item 4. The distributed power system as in Item 1 or any of the Items depending from Item 1, wherein the common substrate comprises a printed circuit board (PCB).

Item 5. The distributed power system as in Item 1 or any of the Items depending from Item 1, wherein each of the plurality of power converters is connected to the corresponding load by a wire having a length less than about 5 inches.

Item 6. The distributed power system as in Item 1 or any of the Items depending from Item 1, wherein each of the plurality of power converters is connected to the corresponding load by a printed circuit board (PCB) trace.

Item 7. The distributed power system as in Item 1 or any of the Items depending from Item 1, wherein the common source comprises an AC-DC converter configured to receive power from an AC power source and convert to DC power.

Item 8. The distributed power system as in Item 1 or any of the Items depending from Item 1, wherein the common source comprises a battery or a generator.

Item 9. The distributed power system as in Item 1 or any of the Items depending from Item 1, wherein at least one of a load from the plurality of loads comprises an amplifier.

Item 10. The distributed power system as in Item 1 or any of the Items depending from Item 1, wherein the power converter providing power to the amplifier comprises an output filter to provide regulate power provided to the amplifier, the output filter comprising a capacitor associated with the amplifier.

Item 11. The distributed power system as in Item 1 or any of the Items depending from Item 1, wherein the capacitor is a bulk capacitor used to provide enough energy to support operation of the amplifier in a pulsed mode, and the distributed power system further comprising a fast capacitor used to provide initial load demand and improve high-frequency regulator response.

Item 12. The distributed power system as in Item 1 or any of the Items depending from Item 1 wherein a phased array system comprises the distributed power system of Item 1.

Item 13. The distributed power system as in Item 1 or any of the Items depending from Item 1, wherein at least one of the power converters from the plurality of converters is configured as a 4-switch step-up/step-down converter that operates in a continuous conduction mode.

Item 14. The distributed power system as in Item 1 or any of the Items depending from Item 1, wherein at least one of the power converters from the plurality of power converters comprises synchronous switches.

Item 15. The distributed power system as in Item 1 or any of the Items depending from Item 1, wherein at least one of the power converters from the plurality of power converters comprises a limiter configured to limit the amount of current or power drawn by the load.

Item 16. The distributed power system as in Item 1 or any of the Items depending from Item 1, wherein at least one of the power converters from the plurality of power converters comprises a sensor configured to sense a current or a voltage drawn by the load.

Item 17. The distributed power system as in Item 1 or any of the Items depending from Item 1, further comprising a programmable processor configured to: monitor the sensor output; and adjust an amount of current or voltage provided to the load.

Item 18. The distributed power system as in Item 1 or any of the Items depending from Item 1, wherein the load is a three-terminal amplifier having a gate terminal, a drain terminal and a source terminal, and the programmable processor is configured to maintain a voltage to the gate terminal below a threshold voltage.

Item 19. The distributed power system as in Item 1 or any of the Items depending from Item 1, wherein each of the power converters is configured to provide voltage in a range from about 20V-100V to the corresponding load.

Item 20. The distributed power system as in any of the Items depending from Item 1, wherein a number of loads in the plurality of loads is between 4 and 12.

Item 21: A system for amplifying high-frequency or pulsed RF signals, the system comprising: an amplifier; and a split capacitor system connected between a power supply and the amplifier, the split capacitor system comprising: a fast capacitor; and a bulk capacitor, wherein the bulk capacitor has a slower response and more energy storage than the fast capacitor.

Item 22. The system as in Item 21 or any of the Items depending from Item 21, wherein the fast capacitor is a ceramic capacitor.

Item 22. The system as in Item 21 or any of the Items depending from Item 21, wherein the bulk capacitor is an electrolytic capacitor.

Item 22. The system as in Item 21 or any of the Items depending from Item 21, the amplifier configured amplify RF signals in a pulsed mode, wherein an initial portion of the current needed for an RF pulse is delivered to the amplifier by the fast capacitor.

Item 22. The system as in Item 21 or any of the Items depending from Item 21, wherein the fast capacitor and the bulk capacitor are connected to a drain terminal of the amplifier.

Item 22. The system as in Item 21 or any of the Items depending from Item 21, wherein the fast capacitor is configured to provide more current than the bulk capacitor in response to a voltage change across the fast capacitor and the bulk capacitor when the rate at which the voltage changes is greater than or equal to about 100 MHz.

Item 22. The system as in Item 21 or any of the Items depending from Item 21, further comprising: a second amplifier; and a second split capacitor system that reduces voltage and/or current variations between the first amplifier and the second amplifier.

Item 28: A system for protecting amplifiers for high-frequency or pulsed RF signals, the system comprising: an amplifier; and a limiter configured to limit the amount of power drawn by the amplifier, the limiter including a plurality of inductors such that power through the limiter always passes through at least one of the plurality of inductors.

Item 29. The system as in Item 28 or any of the Items depending from Item 28, wherein the limiter is a voltage limiter configured to maintain a constant voltage across an output inductor through which an output current passes.

Item 30. The system as in Item 28 or any of the Items depending from Item 28, wherein the limiter is a current limiter configured to maintain a constant current across an output inductor through which an output current passes.

Item 31. The system as in Item 28 or any of the Items depending from Item 28, further comprising: an input inductor configured to receive an input current; and a second switch connected between a first ground and an input of the input inductor, the system configured to open the second switch in response to an overvoltage or overcurrent status and thereby shunt the input current at least partially to ground.

Item 32. The system as in Item 28 or any of the Items depending from Item 28, further comprising: an output inductor configured to receive an output current; a capacitor connected between the output inductor and a second ground; and a third switch connected between the capacitor and an input inductor, the system configured to open the third switch in response to an overvoltage or overcurrent status and thereby shunt the input current at least partially to the capacitor.

Item 33. The system as in Item 28 or any of the Items depending from Item 28, wherein the switches are connected to a control system configured to open the second switch and the third switch synchronously in response to an overvoltage or overcurrent status.

Item 34: A system comprising: a battery; an amplifier powered by the battery; and at least one programmable processor; a non-transitory machine-readable medium storing instructions which, when executed by the at least one programmable processor, cause the at least one programmable processor to perform operations comprising: monitoring, with a sensor, gate voltage of the amplifier; determining that the gate voltage is not, or is expected not to be, in a range between an upper threshold and a lower threshold; and maintaining the voltage to be within the range between the upper threshold and the lower threshold.

Item 35. The system as in Item 34 or any of the Items depending from Item 34, wherein the range is between −2V and −5V.

Item 36. The system as in Item 34 or any of the Items depending from Item 34, the maintaining comprising drawing power from a battery backup system to maintain the gate voltage to be within the range.

Item 37. The system as in Item 34 or any of the Items depending from Item 34, the operations further comprising shutting off a supply voltage to the amplifier.

Item 38. The system as in Item 34 or any of the Items depending from Item 34, the operations further comprising determining, by a machine-learning algorithm, a gate voltage threshold that is the most positive voltage in the range.

Item 39. The system as in Item 34 or any of the Items depending from Item 34, the operations further comprising controlling a power sequencer to provide power to a bias controller to turn on or turn off the amplifier.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" (or "computer readable medium") refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" (or "computer readable signal") refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, one or more aspects or features of the subject matter described herein can be implemented on a computer having a display device, such as for example a cathode ray tube (CRT) or a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including, but not limited to, acoustic, speech, or tactile input. Other possible input devices include, but are not limited to, touch screens or other touch-sensitive devices such as single or multi-point resistive or capacitive trackpads, voice recognition hardware and software, optical scanners, optical pointers, digital image capture devices and associated interpretation software, and the like.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The subject matter described herein can be embodied in systems, apparatus, methods, computer programs and/or articles depending on the desired configuration. Any methods or the logic flows depicted in the accompanying figures and/or described herein do not necessarily require the particular order shown, or sequential order, to achieve desirable results. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. The implementations described above can be directed to various combinations and subcombinations of the disclosed features and/or combinations and subcombinations of further features noted above. Furthermore, above described advantages are not intended to limit the application of any issued claims to processes and structures accomplishing any or all of the advantages.

Additionally, section headings shall not limit or characterize the invention(s) set out in any claims that may issue from this disclosure. Further, the description of a technology in the "Background" is not to be construed as an admission that technology is prior art to any invention(s) in this disclosure. Neither is the "Summary" to be considered as a characterization of the invention(s) set forth in issued claims. Furthermore, any reference to this disclosure in general or use of the word "invention" in the singular is not intended to imply any limitation on the scope of the claims set forth below. Multiple inventions may be set forth according to the limitations of the multiple claims issuing from this disclosure, and such claims accordingly define the invention(s), and their equivalents, that are protected thereby.

What is claimed is:

1. A distributed power system configured to provide power to a plurality of loads, the system comprising:
   a plurality of power converters configured to receive DC power from a common power source, each of the plurality of power converters configured to provide DC power to a corresponding load from the plurality of loads, wherein each of the plurality of power converters is positioned proximal to the corresponding load that it powers.

2. The distributed power system of claim 1, wherein each of the plurality of power converters is integrated with the corresponding load.

3. The distributed power system of claim 1, wherein each of the plurality of power converters is connected to the corresponding load by a printed circuit board (PCB) trace.

4. The distributed power system of claim 1, wherein the common source comprises an AC-DC converter configured to receive power from an AC power source and convert to DC power.

5. The distributed power system of claim 1, wherein the common source comprises a battery or a generator.

6. The distributed power system of claim 1, wherein at least one of a load from the plurality of loads comprises an amplifier.

7. A phased array system comprising the distributed power system of claim 1.

8. The distributed power system of claim 1, wherein at least one of the power converters from the plurality of power converters comprises a limiter configured to limit the amount of current or power drawn by the load.

9. The distributed power system of claim 1, wherein at least one of the power converters from the plurality of power converters comprises a sensor configured to sense a current or a voltage drawn by the load.

10. The distributed power system of claim 9, further comprising a programmable processor configured to:
    monitor the sensor output; and
    adjust an amount of current or voltage provided to the load.

11. The distributed power system of claim 10, wherein the load is a three-terminal amplifier having a gate terminal, a drain terminal and a source terminal, and the programmable processor is configured to maintain a voltage to the gate terminal below a threshold voltage.

12. The distributed power system of claim 1, wherein each of the power converters is configured to provide voltage in a range from about 20V-100V to the corresponding load.

13. A system for protecting amplifiers for high-frequency or pulsed RF signals, the system comprising:
    an amplifier; and
    a limiter configured to limit the amount of power drawn by the amplifier, the limiter including a plurality of inductors such that power through the limiter always passes through at least one of the plurality of inductors.

14. The system of claim 13, wherein the limiter is a voltage limiter configured to maintain a constant voltage across an output inductor through which an output current passes.

15. The system of claim 13, wherein the limiter is a current limiter configured to maintain a constant current across an output inductor through which an output current passes.

16. A system comprising:
    a battery;
    an amplifier powered by the battery; and
    at least one programmable processor;
    a non-transitory machine-readable medium storing instructions which, when executed by the at least one programmable processor, cause the at least one programmable processor to perform operations comprising:
        monitoring, with a sensor, gate voltage of the amplifier;
        determining that the gate voltage is not, or is expected not to be, in a range between an upper threshold and a lower threshold; and
        maintaining the voltage to be within the range between the upper threshold and the lower threshold.

17. The system of claim 16, wherein the range is between −2V and −5V.

18. The system of claim 16, the maintaining comprising drawing power from a battery backup system to maintain the gate voltage to be within the range.

19. The system of claim 16, the operations further comprising shutting off a supply voltage to the amplifier.

20. The system of claim 16, the operations further comprising determining, by a machine-learning algorithm, a gate voltage threshold that is the most positive voltage in the range.

* * * * *